United States Patent
Di et al.

(10) Patent No.: US 12,150,375 B2
(45) Date of Patent: Nov. 19, 2024

(54) DIPOLAR MOLECULE STABILIZED PEROVSKITE MATERIAL AND OPTOELECTRONIC DEVICES

(71) Applicant: ZHEJIANG UNIVERSITY, Hangzhou (CN)

(72) Inventors: Dawei Di, Hangzhou (CN); Bingbing Guo, Hangzhou (CN); Yaxiao Lian, Hangzhou (CN); Baodan Zhao, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 4 days.

(21) Appl. No.: 18/499,841

(22) Filed: Nov. 1, 2023

(65) Prior Publication Data

US 2024/0090317 A1   Mar. 14, 2024

Related U.S. Application Data

(63) Continuation of application No. PCT/CN2023/073839, filed on Jan. 30, 2023.

(30) Foreign Application Priority Data

Dec. 1, 2021   (CN) .......................... 202111447766.0

(51) Int. Cl.
*H10K 85/50* (2023.01)
*H10K 50/11* (2023.01)
(Continued)

(52) U.S. Cl.
CPC ............. *H10K 85/50* (2023.02); *H10K 50/11* (2023.02); *H10K 71/00* (2023.02); *H10K 85/30* (2023.02); *Y02E 10/549* (2013.01)

(58) Field of Classification Search
CPC ........ H10K 85/30; H10K 50/11; H10K 71/00; H10K 85/50; Y02E 10/549
See application file for complete search history.

(56) References Cited

U.S. PATENT DOCUMENTS

2011/0250295 A1   10/2011   Verkaar et al.
2017/0084848 A1*   3/2017   Gao ..................... C09K 11/664
(Continued)

FOREIGN PATENT DOCUMENTS

CN   102144313 A   8/2011
CN   104039879 A   9/2014
(Continued)

OTHER PUBLICATIONS

Internation Search Report of PCT/CN2023/073839, Mailed May 30, 2023.

*Primary Examiner* — Ermias T Woldegeorgis

(57) ABSTRACT

Provided are a dipolar molecule-stabalized perovskite material and an optoelectronic device. The invention aims to provide the perovskite material with the stable dipolar molecules and the optoelectronic device, which can indirectly enhance an interaction between metal cations and halogen anions, reduce a defect state density in the perovskite material, and inhibit ion migration in the perovskite material by utilizing dipolar groups in a dipolar molecule stabilizer. A component of the perovskite material with the stable dipolar molecules is D: A' 2An-1BnX3n+1 or D: ABX3, wherein A' is an organic amine cation, A is a monovalent cation, B is a metal cation, X is a monovalent anion, and D is the dipolar molecule stabilizer. A thermal stability, a phase stability and a photoluminescence stability of the material are remarkably enhanced, and working stabilities and efficiencies of the perovskite material and the optoelectronic device are remarkably improved.

9 Claims, 26 Drawing Sheets

(51) Int. Cl.
  *H10K 71/00* (2023.01)
  *H10K 85/30* (2023.01)

(56) References Cited

U.S. PATENT DOCUMENTS

2017/0246438 A1  8/2017  Aran et al.
2019/0312155 A1  10/2019  Bivolarsky et al.

FOREIGN PATENT DOCUMENTS

| CN | 106800514 A | 6/2017 | |
|---|---|---|---|
| CN | 108630825 A | 10/2018 | |
| CN | 110190139 A | 8/2019 | |
| CN | 110880551 A | 3/2020 | |
| CN | 111808609 A | 10/2020 | |
| CN | 111916572 A | 11/2020 | |
| CN | 112349845 A | 2/2021 | |
| CN | 112919537 A | 6/2021 | |
| CN | 112960691 A | 6/2021 | |
| CN | 113346022 A | 9/2021 | |
| CN | 114220937 A | 3/2022 | |
| EP | 2850669 B1 * | 2/2016 | ........... H01G 9/004 |

* cited by examiner

DIPOLAR MOLECULE STABILIZED PEROVSKITE MATERIAL AND OPTOELECTRONIC DEVICES

TECHNICAL FIELD

The present invention relates to the field of photoelectric materials and technologies.

BACKGROUND OF THE PRESENT INVENTION

Perovskite has excellent photoelectric properties, such as a high carrier mobility, a long carrier diffusion distance, preparation by a solution method, a continuously adjustable band gap, a low defect state density, a wide spectral absorption range, a high luminous efficiency and a narrow spectral bandwidth, and at present, the perovskite has been widely applied and studied in many semiconductor device fields of solar batteries, light-emitting diodes, lasers, X-ray detectors, field effect transistors and the like. In 2009, a solar battery based on a perovskite material was reported for the first time, which opened the curtain for the application of the perovskite material to the solar battery, and subsequently, the solar battery based on the perovskite material developed rapidly. At present, a power conversion efficiency of the solar battery has exceeded 25%, and a working stability of the solar battery has reached thousands of hours. However, since the working stability of the solar battery is restricted by the perovskite material, the device is still far from a commercial standard. Meanwhile, the application of the perovskite material to a light-emitting device has also attracted great interest of researchers. Since the first report of a perovskite light-emitting diode working at room temperature in 2014, the application of the perovskite material in the field of light-emitting devices has developed rapidly. In 2018, an external quantum efficiency (EQE) of the perovskite light-emitting diode exceeded 20%. At present the external quantum efficiency of the perovskite light-emitting diode is close to 30%, which is comparable to inorganic and organic light-emitting diodes with an excellent performance. Although an efficiency of a optoelectronic devices based on the perovskite material is comparable to efficiencies of commercial inorganic and organic optoelectronic devices, the light-emitting diode based on the perovskite still has very poor stability. A $T_{50}$ lifetime of the light-emitting diode based on the perovskite (time for an electroluminescent intensity of a device to decay to 50% of initial intensity) reported by most research groups is still 0.1 hour to 100 hours, and the working stability of the device is still challenging. At present, the light-emitting diode for commercial application generally needs to ensure that the $T_{50}$ lifetime is more than 10,000 hours under a condition that an initial radiance is 0.2 W $sr^{-1}$ $m^{-2}$ to 2.1 W $sr^{-1}$ $m^{-2}$. Therefore, instabilities of the perovskite material and the optoelectronic devices are the key challenges that restrict the commercial application, so that the high-stability and high-efficiency perovskite material and optoelectronic devices are needed urgently.

SUMMARY OF PRESENT INVENTION

The present invention aims to provide a perovskite material with stable dipolar molecules and a optoelectronic devices, which can indirectly enhance an interaction between metal cations and halogen anions, reduce a defect state density in the perovskite material, and inhibit ion migration in the perovskite material by utilizing dipolar groups in a dipolar molecule stabilizer.

According to the present invention, a component of the perovskite material with the stable dipolar molecules is D: A'$_2$A$_{n-1}$B$_n$X$_{3n+1}$, wherein n=1, 2, 3, . . . , or D: ABX$_3$, wherein A' is an organic amine cation, A is a monovalent cation, B is a metal cation, X is a monovalent anion, and D is a dipolar molecule stabilizer, and a molar ratio of D to B is 0% to 50% with a B-site as a reference; the dipolar molecular stabilizer is a molecular material with positively charged and negatively charged groups or atoms in molecules; and the dipolar molecular stabilizer contains atoms or groups capable of forming an interaction such as an ionic bond or a coordination bond with the anion X and the cations A', A and B in perovskite, wherein the positively charged atoms or groups comprise but are not limited to $N^+$ and the negatively charged atoms or groups comprise but are not limited to $SO_3^{3-}$, $PO^{4-}$, $COO^-$, $N^-$ and $O^-$.

According to the present invention, for a optoelectronic devices adopting the perovskite material and an application thereof, the optoelectronic devices comprises a light emitting device, a solar battery, a field effect transistor and a detector optoelectronic device, wherein the optoelectronic devices is composed of the perovskite material and one or more functional materials of a substrate, an anode, a hole transport layer, an electron transport layer and a cathode device; and materials of a light emitting film, photoluminescent powder, a nanocrystal, a quantum dot, a single crystal and an X-ray scintillator are applied.

According to the present invention, a preparation method of the perovskite material comprises: dissolving A' X, AX, BX and the dipolar molecular stabilizer in a solvent to obtain a perovskite precursor solution or a nanocrystal, and preparing the perovskite material and a optoelectronic devices by a solution method; or, dissolving A'X, AX and BX in the solvent to obtain the perovskite precursor solution and preparing the perovskite material, and introducing the dipolar molecular stabilizer into the perovskite through postprocessing, thus preparing the stable perovskite material and the optoelectronic devices; or, preparing A'X, AX, BX and the dipolar molecular stabilizer into the stable perovskite material and the optoelectronic devices by a non-solution method such as evaporation, vapor deposition, magnetron sputtering and solid-state reaction; or, preparing A'X, AX and BX into the perovskite material by the non-solution method such as evaporation, vapor deposition, magnetron sputtering and solid-state reaction, and introducing the dipolar molecular stabilizer into the perovskite through postprocessing, thus preparing the stable perovskite material and the optoelectronic devices; or, preparing and producing the stable perovskite material and the optoelectronic devices by one or a combination of several of the above processes.

According to the present invention, the dipolar molecular stabilizer contains the positively charged and negatively charged groups or atoms capable of interacting with the anions and the cations in the perovskite, wherein the positively charged groups comprise but are not limited to $N^+$ and the negatively charged groups comprise but are not limited to $SO_3^{3-}$, $PO^{4-}$, $COO^-$, $N^-$ and $O^-$; the dipolar molecular stabilizer comprises but is not limited to the following compounds, and is any one or a mixture of several of the following compounds in any proportion: sulfobetaine 8, sulfobetaine 10, sulfobetaine 12, tetradecyl sulfopropyl betaine, hexadecyl sulfopropyl betaine, octadecyl sulfopropyl betaine, methacryloylethyl sulphobetaine, [3-(methacrylamido)propyl]dimethyl(3-thiopropyl)ammonium hydroxide, 3-[3-(cholamidopropyl)dimethylamino]propanesulfonic acid inner salt, (methoxycarbonylaminosulfonyl)triethylammonium hydroxide, 2-methacryloyloxyethyl phosphorylcholine, pyridinium propanesulfonate, (2-hydroxyethyl)dimethyl(3-sulfopropyl)ammonium hydroxide lactone, N-methylimidazolium sulfobutyrolactone, cocoamidopropyl betaine, dodecyldimethylamine oxide, 3-(benzyldimethylammonium)propanesulfonate.

According to the present invention, the perovskite is prepared into 0.13 mol $L^{-1}$ precursor solution by dissolving FAI PbI$_2$, and a dipolar molecular additive in 1 mL of DMF according to a molar ratio of 2:1:x (x=0-0.5).

According to the present invention, the dipolar molecular stabilizer adjusts a crystallization rate of the perovskite material through a chemical action, and improves a crystallinity.

According to the present invention, the dipolar molecular stabilizer improves thermal stabilities, phase stabilities and photoluminescence stabilities of the perovskite material and a perovskite device.

According to the present invention, the dipolar molecular stabilizer reduces a defect state density of the perovskite material, and improves a working stability and an efficiency of a perovskite device.

According to the present invention, the dipolar molecular stabilizer inhibits ion migration in the perovskite material, and inhibits hysteresis of a perovskite optoelectronic devices during working.

According to the present invention, a thermal stability, a phase stability and a photoluminescence stability of the material are remarkably enhanced, and working stabilities and efficiencies of the perovskite material and the optoelectronic devices are remarkably improved. The present invention has positive effects as follows:

(1) the dipolar molecular stabilizer improves the thermal stabilities, the phase stabilities and the photoluminescence stabilities of the perovskite material and the perovskite device;
(2) the dipolar molecular stabilizer adjusts the crystallization rate of the perovskite material through the chemical action, and improves the crystallinity;
(3) the dipolar molecular stabilizer reduces the defect state density of the perovskite material, and improves a quantum efficiency and an energy conversion efficiency of the perovskite device;
(4) the dipolar molecular stabilizer inhibits ion migration in the perovskite material, and inhibits hysteresis of the perovskite optoelectronic devices during working; and
(5) the dipolar molecular stabilizer remarkably improves the working stability, the efficiency and other performances of the perovskite device.

DETAILED DESCRIPTION OF PREFERRED EMBODIMENTS

Figure 1:
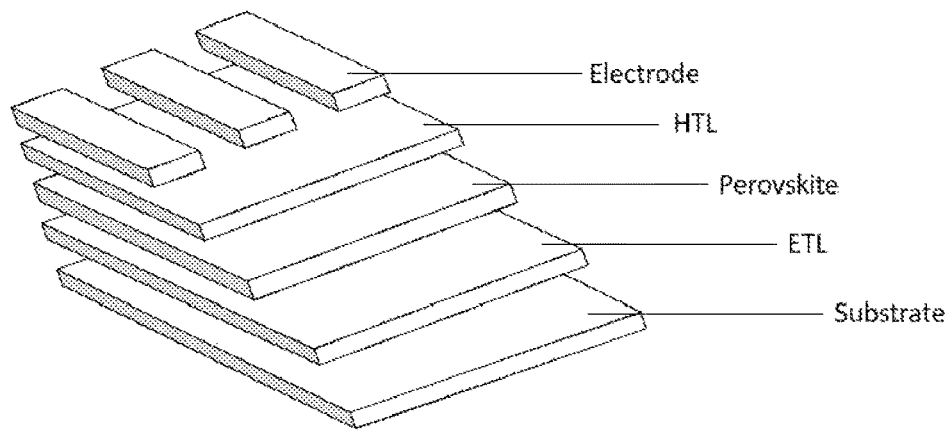
FIG. 1 is a schematic structural diagram of a perovskite light-emitting diode in Embodiment 1 of the present invention.

According to the present invention a general structural formula of the perovskite is D: A'$_2$A$_{n-1}$B$_n$X$_{3n+1}$ (n=1, 2, 3, . . . ) or D: ABX$_3$ wherein A' is an organic amine cation, such as a phenylethylamine cation (PEA$^+$), a phentermine cation (PBA$^+$), a 1,4-butanediamine cation (BDA$^{2+}$), a p-fluorophenylethylamine cation (p-F-PEA$^+$), and a 2-(4-methoxyphenyl)ethylamine cation (MOPEA$^+$); A is a monovalent cation, such as a cesium ion (Cs$^+$), a methylamine ion (MA$^+$), a formamidine ion (FA$^+$), an ethylamine ion (EA$^+$), a hydrazine ion (HA$^+$), a guanidine ion (GA$^+$), an isopropylamine ion (IPA$^+$) and an imidazole ion (IA$^+$). B is a metal cation, such as a lead ion (Pb$^{2+}$), a tin ion (Sn$^{2+}$), a germanium ion (Ge$^{2+}$), an indium ion (In$^{2+}$), a bismuth ion (Bi$^{2+}$), a silver ion (Ag$^+$) and a sodium ion (Na$^+$); and X is an anion, which comprises a chloride ion (Cl$^-$), a bromide ion (Br$^-$), an iodide ion (I$^-$), and the like. D is a dipolar molecular stabilizer. The dipolar molecular stabilizer is a molecular material with positively charged and negatively charged groups or atoms in molecules; and the dipolar molecular stabilizer contains atoms or groups capable of forming an interaction with the anions and the cations in perovskite. The positively charged atoms or groups comprise but are not limited to N$^+$, and the negatively charged atoms or groups comprise but are not limited to SO$^{3-}$, PO$^{4-}$, COO$^-$, N$^-$ and the like.

For a optoelectronic devices based on the perovskite material with the stable dipolar molecules and an application thereof, the optoelectronic devices comprises a light emitting device, a solar battery, a transistor, a detector optoelectronic devices and other optoelectronic devices, wherein the optoelectronic devices is generally composed of a substrate, an anode, a hole transport layer, a perovskite layer, an electron transport layer and a cathode; and materials of a light emitting film, photoluminescent powder, a nanocrystal, a quantum dot, a single crystal, an X-ray scintillator and the like are applied.

A preparation method of the perovskite material comprises: dissolving A' X, AX, BX and the dipolar molecular stabilizer in a solvent (comprising but being not limited to one or a mixed solvent of DMF, DMSO, GBL, NMP, acetonitrile and the like) to obtain a perovskite precursor solution or a nanocrystal, and preparing a stable perovskite material and optoelectronic devices by a solution method such as spin coating, spray coating, scrape coating and roll-to-roll printing; or, dissolving A'X, AX and BX in the solvent to obtain the perovskite precursor solution and preparing the perovskite material, and introducing the dipolar molecular stabilizer into the perovskite through postprocessing, thus preparing the stable perovskite material and the optoelectronic devices; or, preparing A'X, AX, BX and the dipolar molecular stabilizer into the stable perovskite material and the optoelectronic devices by a non-solution method such as evaporation, vapor deposition, magnetron sputtering and solid-state reaction; or, preparing A'X, AX and BX into the perovskite material by the non-solution method such as evaporation, vapor deposition, magnetron sputtering and solid-state reaction, and introducing the dipolar molecular stabilizer into the perovskite through postprocessing, thus preparing the stable perovskite material and the optoelectronic devices; or, preparing and producing the stable perovskite material and the optoelectronic devices by one or a combination of several of the above processes.

In the preparation method, the dipolar molecular stabilizer comprises but is not limited to the following compounds, and may be any one or a mixture in any proportion of the following compounds:

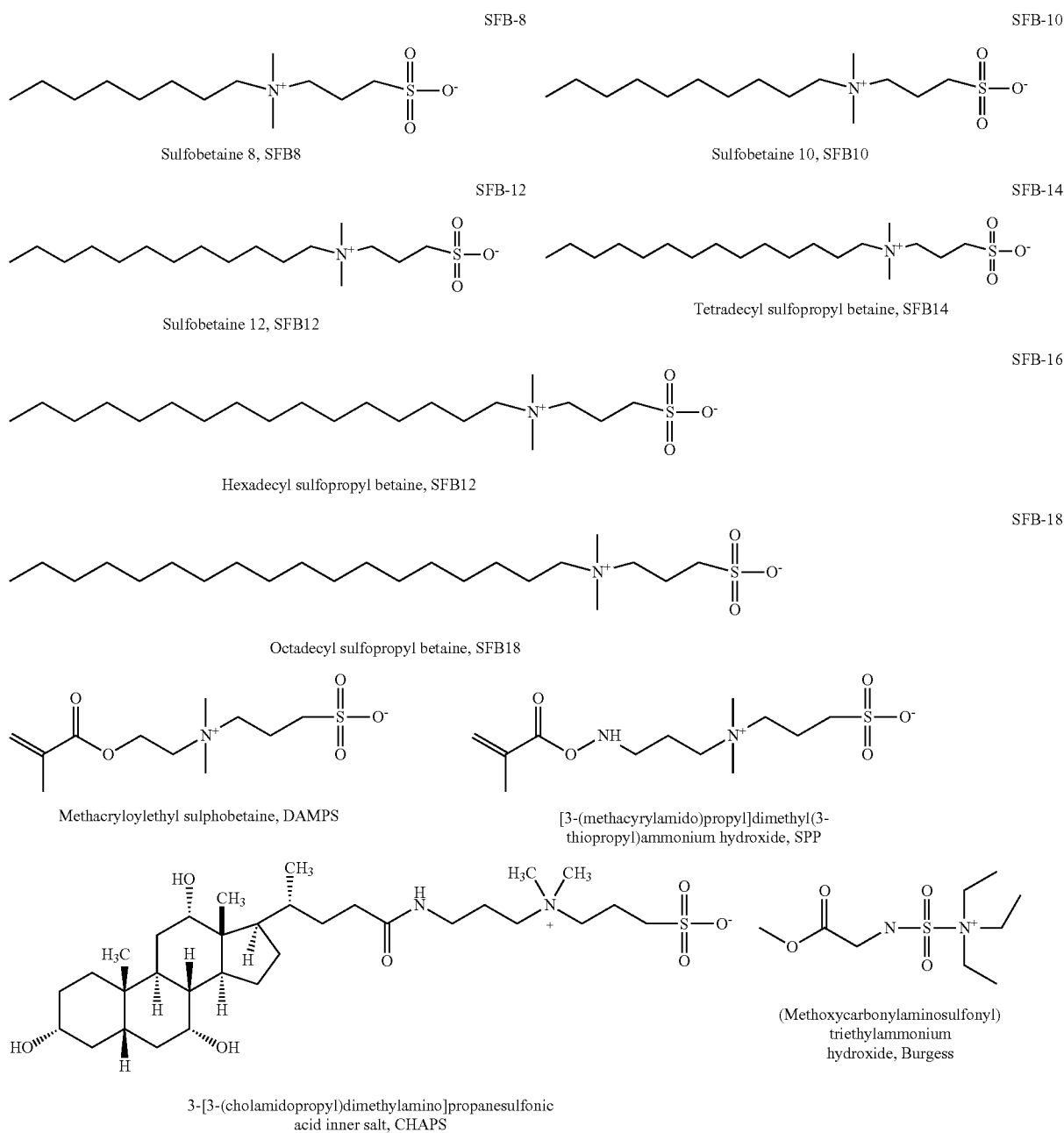

-continued

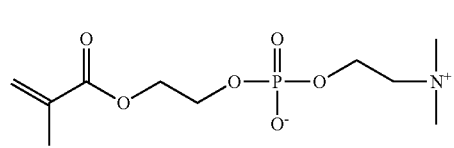

2-methacryloyloxyethyl phosphorylcholine, MATEP

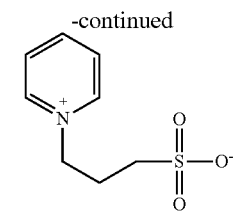

Pyridinium propanesulfonate, PPS

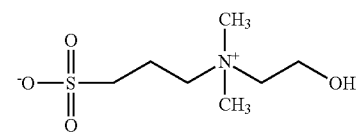

(2-hydroxyethyl)dimethyl(3-sulfopropyl) ammonium hydroxide lactone, NDSB

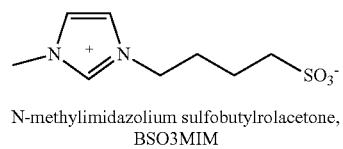

N-methylimidazolium sulfobutylrolacetone, BSO3MIM

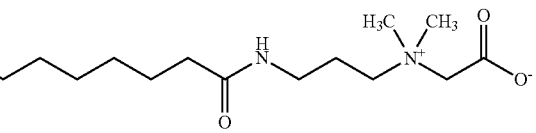

Cocoamidopropyl betaine, Mirataine CB

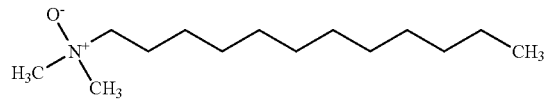

Dodecyldimethylamine oxide, LADO

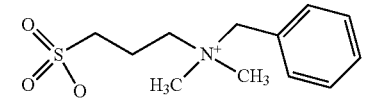

3-(Benzyldimethylammonium)propanesulfonate

FIG. 1 is a schematic structural diagram of the device. The device is composed of the substrate, the electron transport layer, the perovskite layer, the hole transport layer and the electrode from bottom to top. The substrate is a base plate with the electrode, the electrode may be any one of indium tin oxide, silver, gold, aluminum, copper, chromium and the like, and the base plate may be any one of glass, a silicon wafer, sapphire, a flexible substrate, a metal sheet and the like. The electron transport layer is a metal oxide (such as $TiO_2$, $SnO_2$ and ZnO), and a surface of the electron transport layer is decorated with a layer of organic substance containing amino or carbonyl (such as PEIE, PEI and PEOz). The perovskite layer is made of a mixed solution of A' X, AX, $BX_2$, D and the like by the solution method. The hole transport layer is Poly-TPD, TFB, F8, Spiro-MeOTAD, a carbazole polymer (such as PVK), an aromatic diamine compound (such as TPD and NPB) or a star triphenylamine compound (such as PTDATA). The electrode layer is any one of silver, gold, aluminum, copper, chromium and the like, and is modified by a metal oxide of MoOX, WOx and the like.

Process Steps:

(1) Preparation of Perovskite Precursor Solution

The perovskite precursor solution is prepared by dissolving A' X, AX, $BX_2$ and the dipolar molecular stabilizer D in the solvent (which may be any one or the mixed solvent of DMF, DMSO, GBL, NMP, acetonitrile and the like), wherein A is the monovalent cation, such as a cesium ion ($Cs^+$), a methylamine ion ($MA^+$), a methylamine ion ($FA^+$), an ethylamine ion ($EA^+$), a hydrazine ion ($HA^+$), a guanidine ion ($GA^+$), an isopropylamine ion ($IPA^+$) and an imidazole ion ($IA^+$); B is the divalent metal cation, such as a lead ion ($Pb^{2+}$), a tin ion ($Sn^{2+}$), a germanium ion ($Ge^{2+}$), an indium ion ($In^{2+}$) and a bismuth ion ($Bi^{2+}$); and X is the anion comprising a chloride ion ($Cl^-$), a bromide ion ($Br^-$), an iodide ion ($I^-$) and the like. A concentration of the perovskite precursor solution is 0.01 mol/L to 0.5 mol/L.

(2) Preparation of Perovskite Light-Emitting Diode

The substrate is washed with deionized water, isopropyl alcohol (IPA) and acetone in sequence in an ultrasonic machine for 15 minutes. Before spin coating, the ITO glass substrate is processed by an ultraviolet ozone machine for 60 minutes. The electron transport layer is prepared by spin coating and annealed for a certain time. The modified layer is prepared by spin coating and annealed for a certain time. Subsequently, the perovskite layer is prepared by the solution method, and one or a mixed solvent of several of chlorobenzene, toluene, ethyl acetate, anhydrous ether, chloroform and the like is introduced in the spin coating process. Then, the hole transport layer is prepared by spin coating, evaporation, magnetron sputtering and atomic layer deposition. Subsequently, the electrode layer is prepared by evaporation, magnetron sputtering and atomic layer deposition.

1. Embodiment 1 Preparation of Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:SFB10=2:1:x (x=0-0.5) to prepare 0.13 mol $L^{-1}$ solution, and subjected to spin coating at 5,000 rpm, and about 5 seconds after starting the spin coating process, 100 µL of chlorobenzene was dropwise added on a sample, and annealed at 100° C. for 10 minutes after finishing the spin coating to obtain a perovskite material. A hole transport layer was TFB, and an electrode was $MoO_x$/Au.

Figure 2:
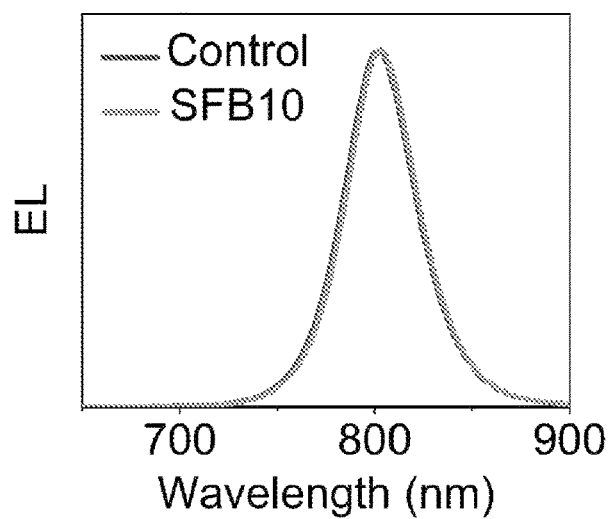
FIG. 2 is a normalized electroluminescent intensity-wavelength relationship diagram of the perovskite light-emitting diode in Embodiment 1 of the present invention.
Figure 3:
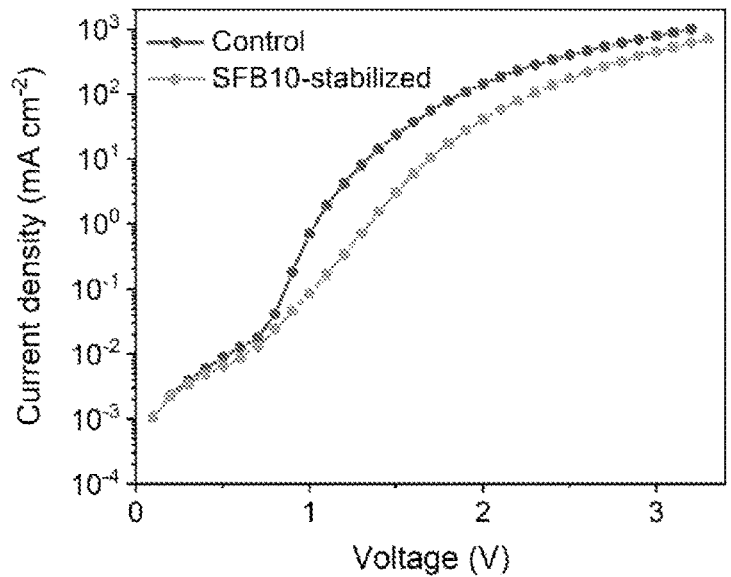
FIG. 3 is a current density-voltage characteristic relationship diagram of the perovskite light-emitting diode in Embodiment 1 of the present invention.
Figure 4:
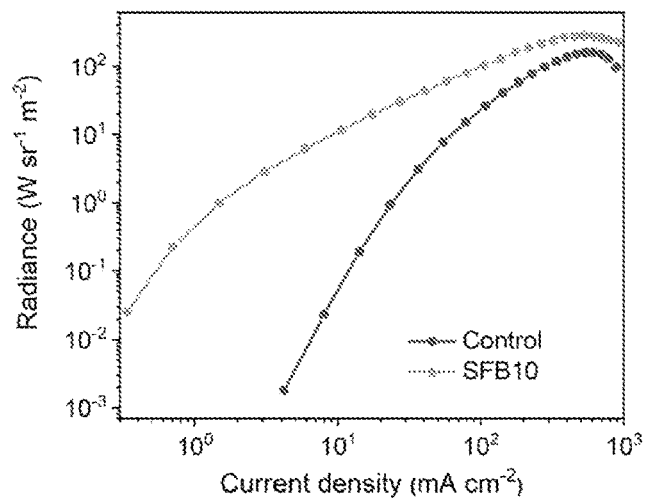
FIG. 4 is a radiance-voltage characteristic relationship diagram of the perovskite light-emitting diode in Embodiment 1 of the present invention.
Figure 5:
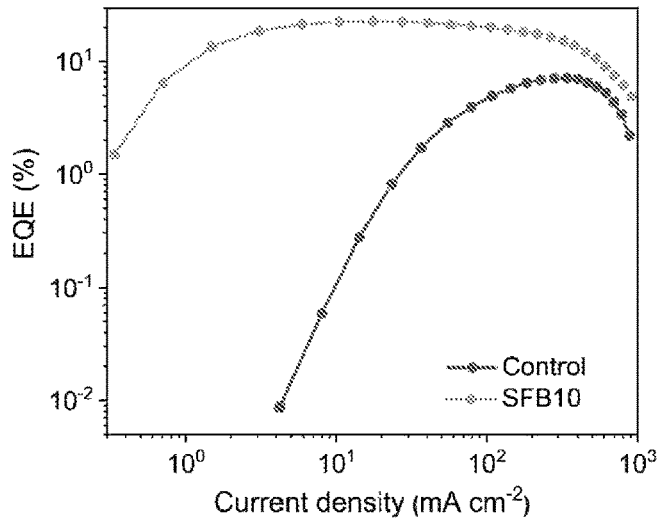
FIG. 5 is an external quantum efficiency-current density characteristic relationship diagram of the perovskite light-emitting diode in Embodiment 1 of the present invention.
Figure 6:
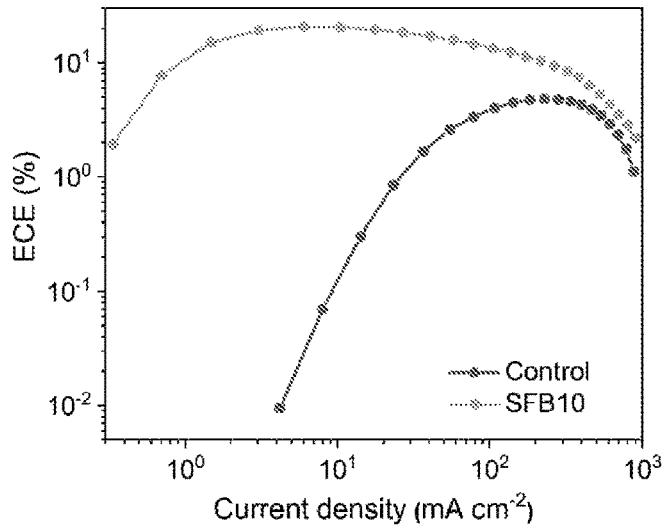
FIG. 6 is an energy conversion efficiency-current density characteristic relationship diagram of the perovskite light-emitting diode in Embodiment 1 of the present invention.

FIG. 2 shows a normalized electroluminescent spectrum of a device without SFB10. It can be seen from the figure that SFB10 does not affect the electroluminescent spectrum of the device.

FIG. 3, FIG. 4, FIG. 5 and FIG. 6 respectively show a current density-voltage characteristic relationship, a radiance-current density characteristic relationship, an external quantum efficiency-current density characteristic relationship and an energy conversion efficiency-current density characteristic relationship of the device without SFB10. It can be seen from the figures that, after introducing SFB10, an external quantum efficiency of the device is increased from 7.1% to 22.8%, a maximum radiance is increased from 158.3 W $sr^{-1}$ $m^{-2}$ to 278.9 W $sr^{-1}$ $m^{-2}$, and an energy conversion efficiency of the device is increased from 4.8% to 20.7%.

Figure 7:
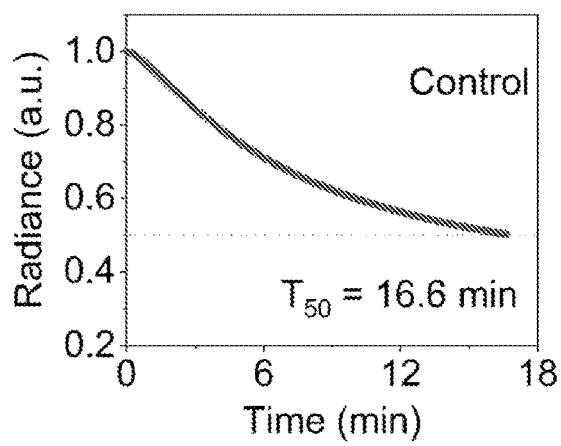
FIG. 7 is a radiance-time relationship diagram of the perovskite light-emitting diode in Embodiment 1 of the present invention.

FIG. 7 is a relationship diagram of radiance changed with time of a device of a control group under a condition of continuously working at an impressed current density of 10 mA/cm². We can know that time ($T^{50}$) for the radiance of the device of the control group to decay to 50% of initial radiance is 16.6 minutes, which indicates that a working stability of the device of the control group is poor.

Figure 8:
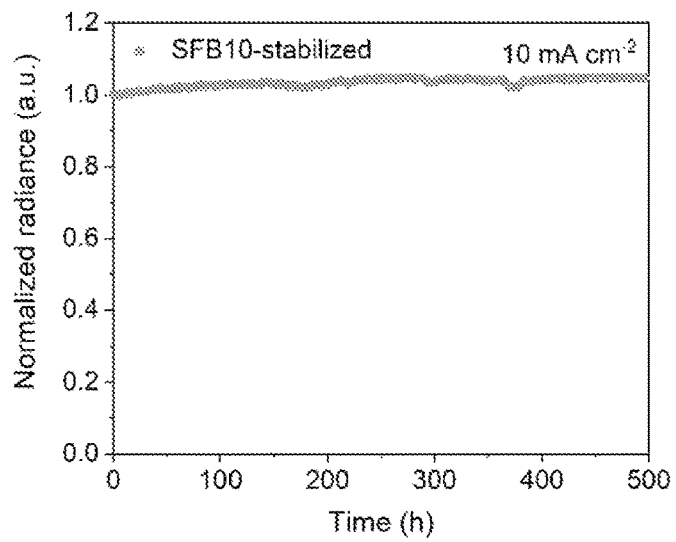
FIG. 8 is a radiance-time relationship diagram of the perovskite light-emitting diode introduced with SFB10 in Embodiment 1 of the present invention.

FIG. 8 is a relationship diagram of radiance changed with time of a device introduced with SFB10 under the condition of continuously working at the impressed current density of 10 mA/cm$^{-2}$ (the initial radiance is about 8.08 W sr$^{-1}$ m$^{-2}$). We can know that a radiance of a device of an experimental group is not obviously reduced within 800 hours, which indicates that a working stability of the device of the experimental group is greatly improved.

Figure 9:
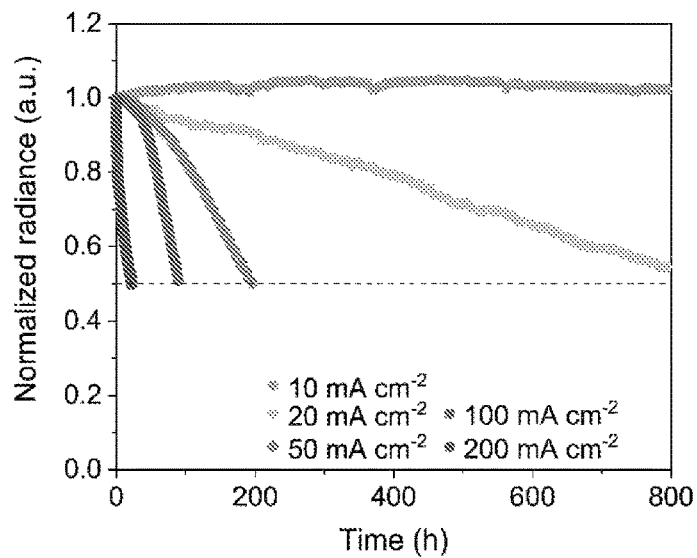
FIG. 9 is a radiance-time relationship diagram of the perovskite light-emitting diode introduced with SFB10 under different current densities in Embodiment 1 of the present invention.

FIG. 9 is a relationship diagram of radiance changed with time of the device introduced with SFB10 under different impressed current densities. We can know that $T_{50}$ lifetimes of the device of the experimental group are respectively 877.1 hours, 195.3 hours, 90.2 hours and 22.4 hours under 20 mA cm$^{-2}$ (~17 W sr$^{-1}$ m$^{-2}$), 50 mA cm$^{-2}$ (~39 W sr$^{-1}$ m$^{-2}$), 100 mA cm$^{-2}$ (~70 W sr$^{-1}$ m$^{-2}$) and 200 mA cm$^{-2}$ (~119 W sr$^{-1}$ m$^{-2}$).

Figure 10:
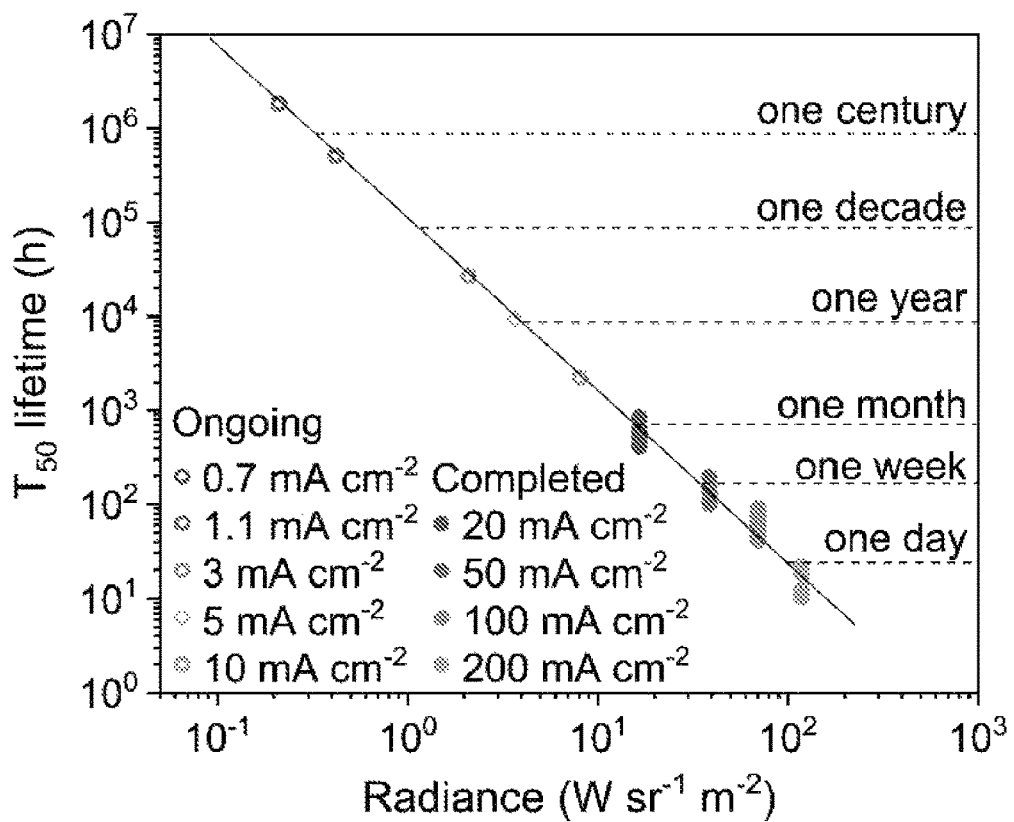
FIG. 10 is a $T_{50}$ lifetime statistical distribution diagram of the perovskite light-emitting diode introduced with SFB10 under different current densities in Embodiment 1 of the present invention.

FIG. 10 is a lifetime statistical distribution diagram of the device introduced with SFB10 under different impressed current densities. A formula of $R0^n \times T^{50}$=constant (R0 is the initial radiance and n is an acceleration factor) may be used to fit the lifetimes of the perovskite light-emitting diode under different radiances. It is obtained by fitting that $T_{50}$ lifetimes of the device under 3.2 mA cm$^{-2}$, 1.1 mA cm$^{-2}$ and 0.7 mA cm$^{-2}$ are respectively 26,574 hours (~3.5 years), 5.1×105 hours (~58 years) and 1.8×106 hours (~2 centuries), which indicates that the perovskite device meets a commercial requirement.

Figure 11:
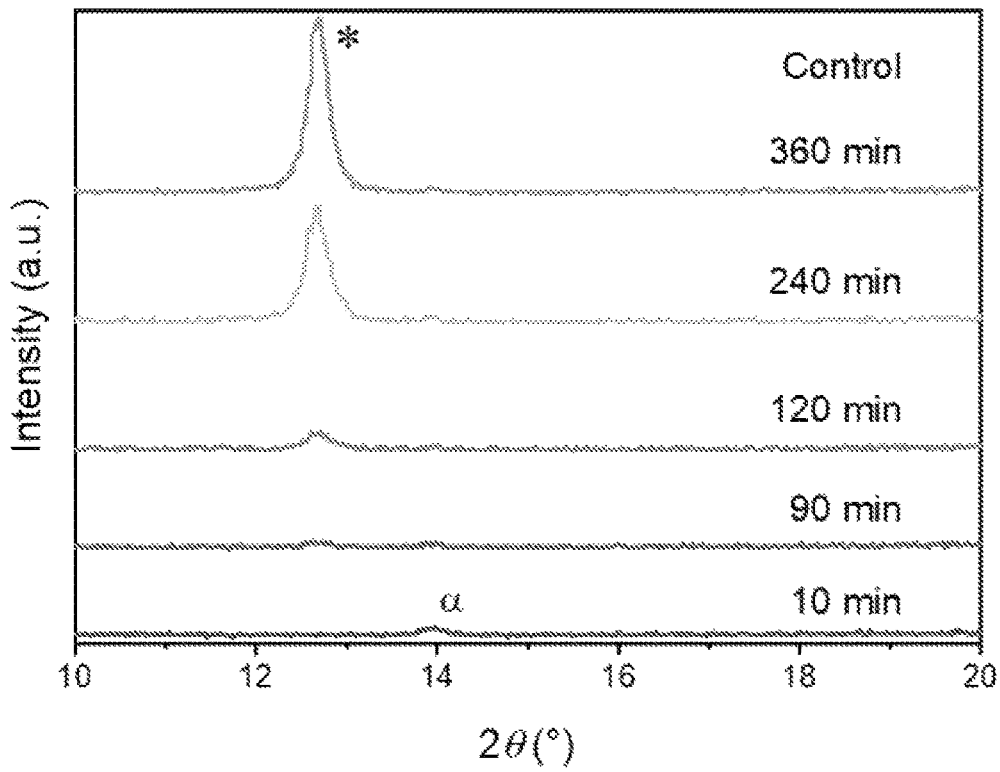
FIG. 11 is an XRD (X-ray diffraction intensity-angle) chart of a perovskite material of a control group under different heating times in Embodiment 1 of the present invention.

FIG. 11 is an X-ray diffraction intensity-angle (XRD) relationship diagram of a perovskite material of a control group under a condition of continuously heating at 100° C. It can be seen from the figure that a diffraction peak (12.6°, * represents a diffraction peak of PbI$_2$) of lead iodide (PbI$_2$) appears in the material of the control group after 90 minutes, which indicates that the perovskite material produces the lead iodide after being heated for 90 minutes; and with further increase of heating time, more and more PbI$_2$, is produced in the material.

Figure 12:
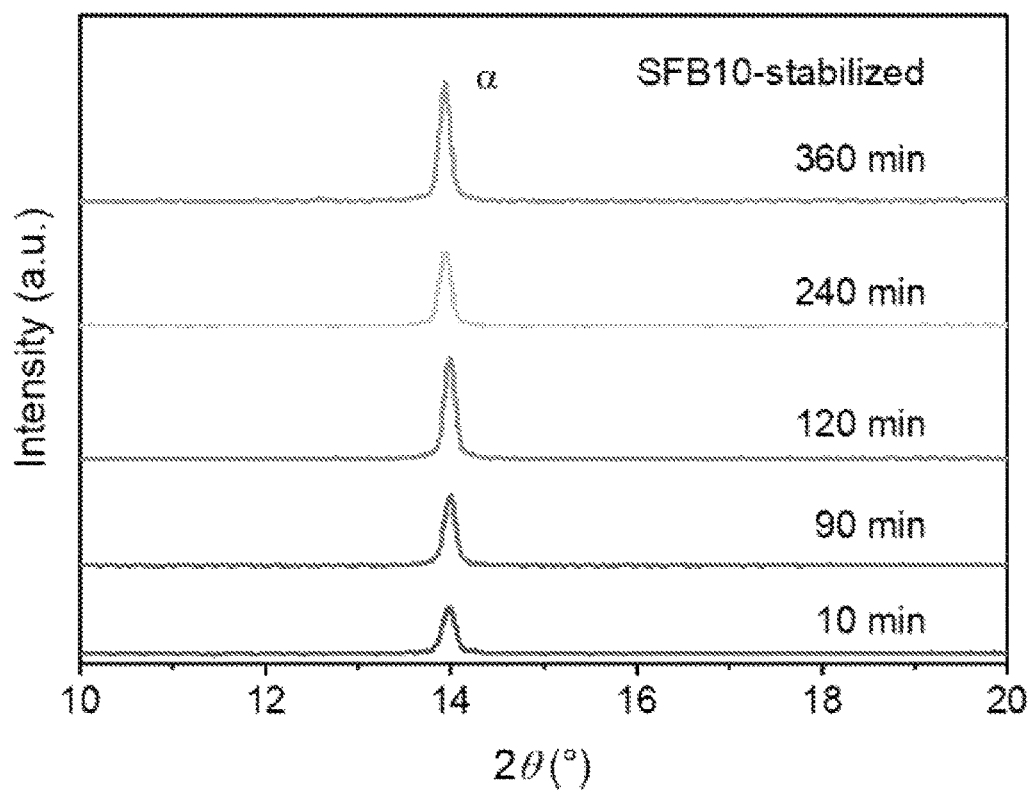
FIG. 12 is an XRD (X-ray diffraction intensity-angle) chart of a material introduced with SFB10 under different heating times in Embodiment 1 of the present invention.

FIG. 12 is an X-ray diffraction intensity-angle (XRD) relationship diagram of a perovskite material (introduced with SFB10) of an experimental group under a condition of continuously heating at 100° C. It can be seen from the figure that no obvious diffraction peak of the lead iodide (PbI$_2$) appears in the perovskite material within 360 minutes (no obvious diffraction peak appears at 12.6°), and a (100)-plane α-phase diffraction peak intensity at 14° is basically unchanged or enhanced, which indicates that a heat stability of the perovskite material is greatly enhanced.

Figure 13:
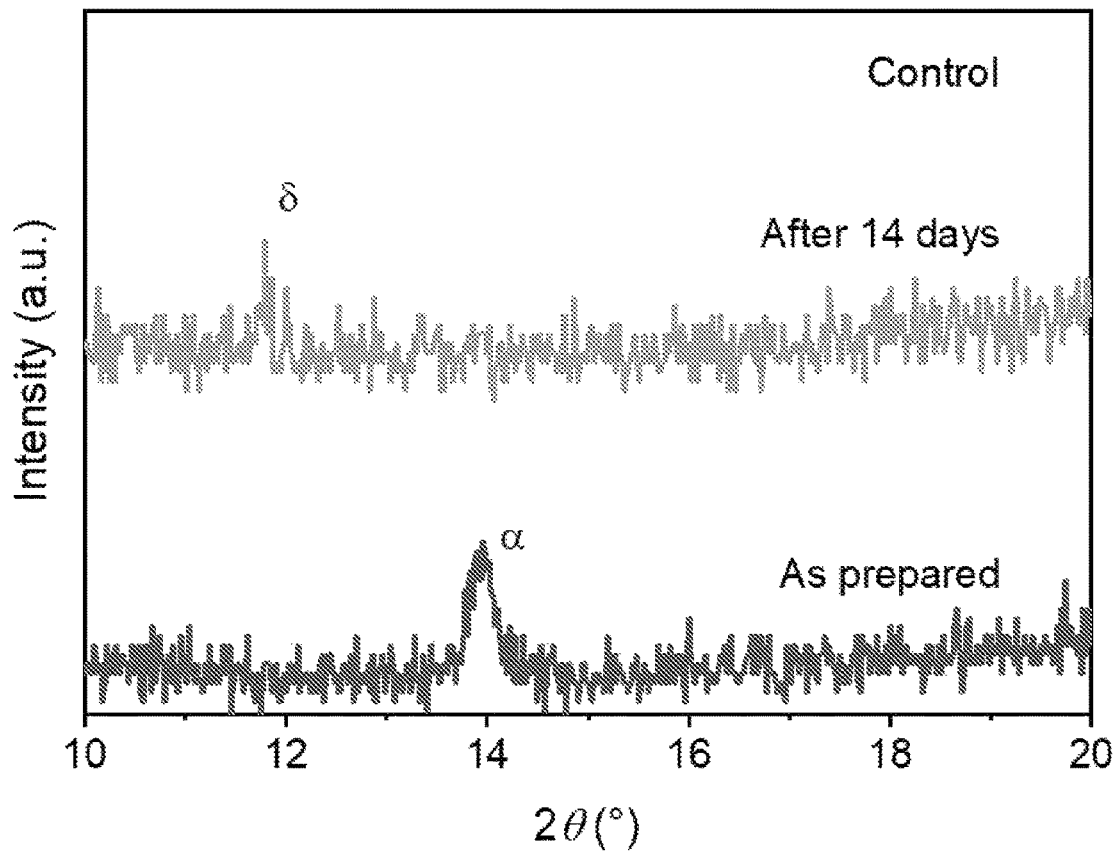
FIG. 13 is an XRD (X-ray diffraction intensity-angle) chart of the material of the control group when placed in air for different times in Embodiment 1 of the present invention.

FIG. 13 is an X-ray diffraction intensity-angle (XRD) relationship diagram of the perovskite material of the control group when placed in air (at 20±5° C. and a relative humidity of 60±15%) for different times. It can be seen from the figure that a (100)-plane α-phase diffraction peak intensity at 14° of the perovskite material of the control group disappears after being placed in air for 14 days, and a new diffraction peak (FAPbI$_3$ corresponding to a δ-phase) appears at 11.8°.

Figure 14:
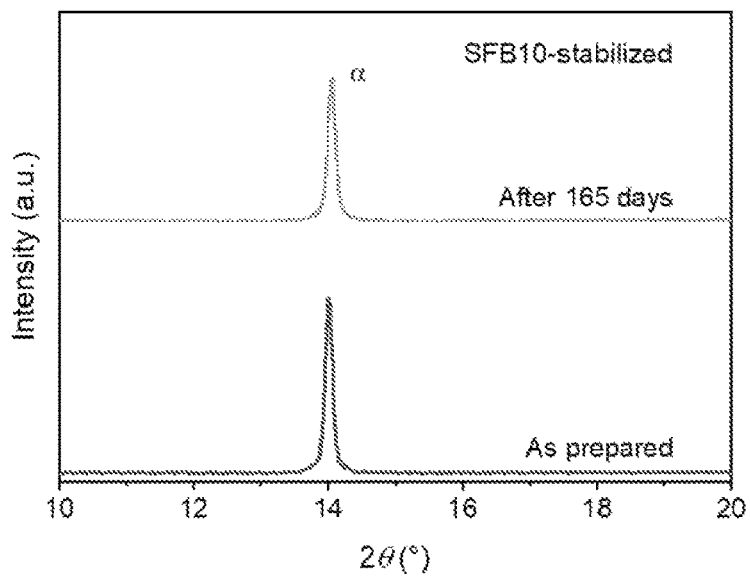
FIG. 14 is an XRD (X-ray diffraction intensity-angle) chart of the material introduced with SFB10 when placed in air for different times in Embodiment 1 of the present invention.

FIG. 14 is an X-ray diffraction intensity-angle (XRD) relationship diagram of a perovskite material introduced with SFB10 when placed in air (at 20±5° C. and a relative humidity of 60±15%) for different times. It can be seen that the (100)-plane α-phase diffraction peak intensity at 14° of the perovskite material of the control group is still very strong after being placed in air for 165 days, and no new diffraction peak appears, which indicates that an air stability of the perovskite material is greatly improved.

Figure 15:
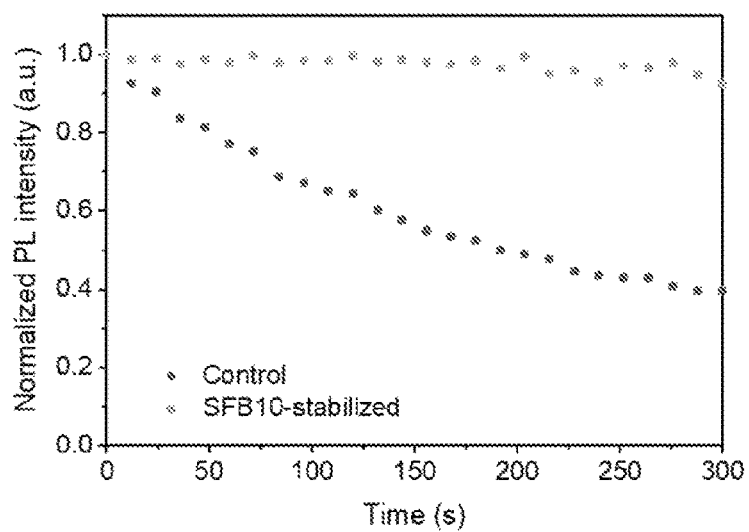
FIG. 15 is a PL intensity-time relationship diagram of the perovskite material when placed in air for different times in Embodiment 1 of the present invention.
Figure 16:
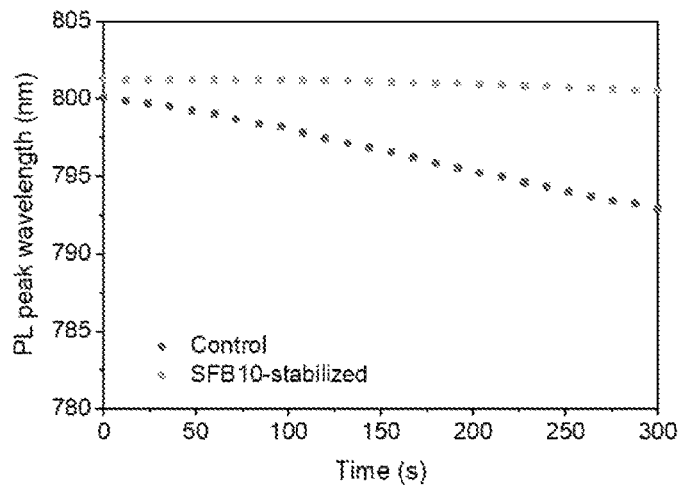
FIG. 16 is a PL peak wavelength-time relationship diagram of the perovskite material when placed in air for different times in Embodiment 1 of the present invention.

FIG. 15 and FIG. 16 are relationship diagrams of normalized photoluminescent intensity and peak wavelength changed with time in air of the material of the control group and the material introduced with SFB10. Excitation light is pulsed femtosecond laser light with excitation power of about 80 μJ cm$^{-2}$ and a repetition frequency of 50 kHz. It can be seen from the figures that the photoluminescent intensity of the material of the control group decays to 40% of original photoluminescent intensity after being irradiated by the laser light for 300 seconds, and the peak wavelength shifts from 800 nm to 793 nm; and the photoluminescent intensity and the peak wavelength of the material introduced with SFB10 after being irradiated by the laser light for 300 seconds are basically unchanged, so that a photoluminescent stability of the perovskite material is also significantly enhanced.

Figure 17:
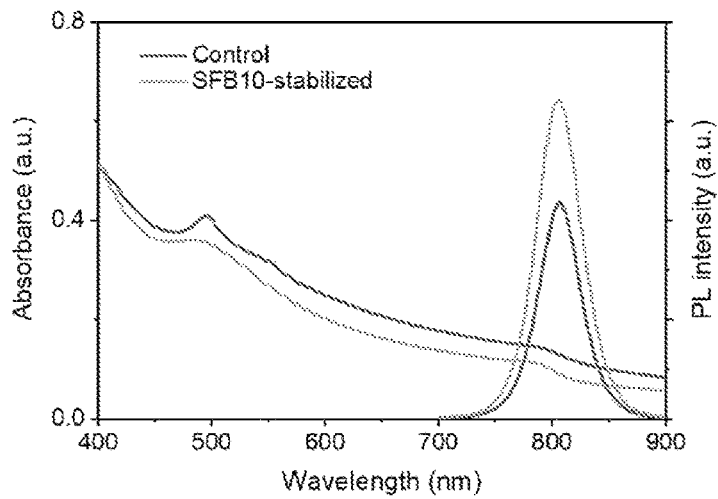
FIG. 17 shows an absorption spectrum (an absorbance-wavelength relationship diagram) and a photoluminescence spectrum (a photoluminescent intensity-wavelength relationship diagram) of the perovskite material in Embodiment 1 of the present invention.

FIG. 17 shows absorption spectra and photoluminescence spectra of the material of the control group and the material introduced with SFB10. It can be seen from the figure that the absorption spectrum of the material of the control group is similar to that of the material introduced with SFB10, with the enhancement of the photoluminescent intensity, which indicates that a luminescence component of perovskite is still FAPbI$_3$, and a defect state density is reduced.

Figure 18:
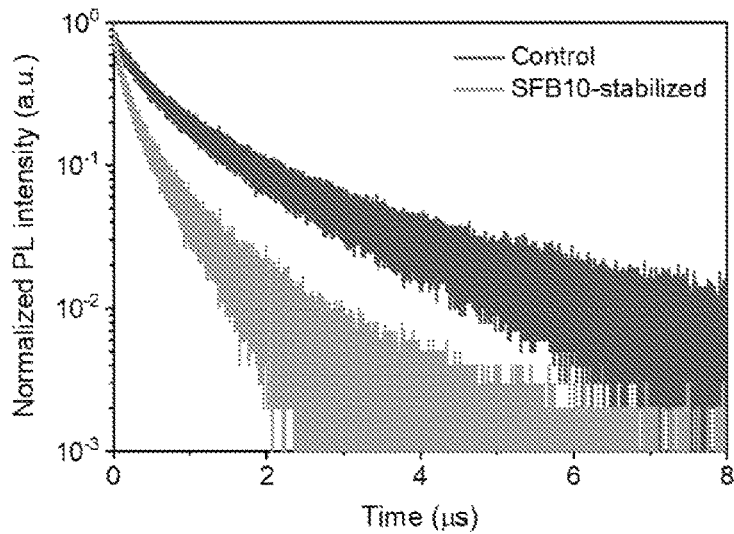
FIG. 18 shows a photoluminescence lifetime (photoluminescent intensity-time) characteristic relationship of the perovskite material in Embodiment 1 of the present invention.

FIG. 18 shows photoluminescence lifetime characteristic relationships (measured by a time-related single photon counting method, photoluminescent intensity-time characteristic curves) of the material of the control group and the material introduced with SFB10. It can be seen from the figure that the photoluminescence lifetime of the material introduced with SFB10 (time for a photoluminescent intensity of molecules to decrease to 1/e of a maximum photoluminescent intensity $I_0$ when excited) is increased from 265 ns to 728 ns, which indicates that a defect state density of the material introduced with SFB10 is reduced.

Figure 19:
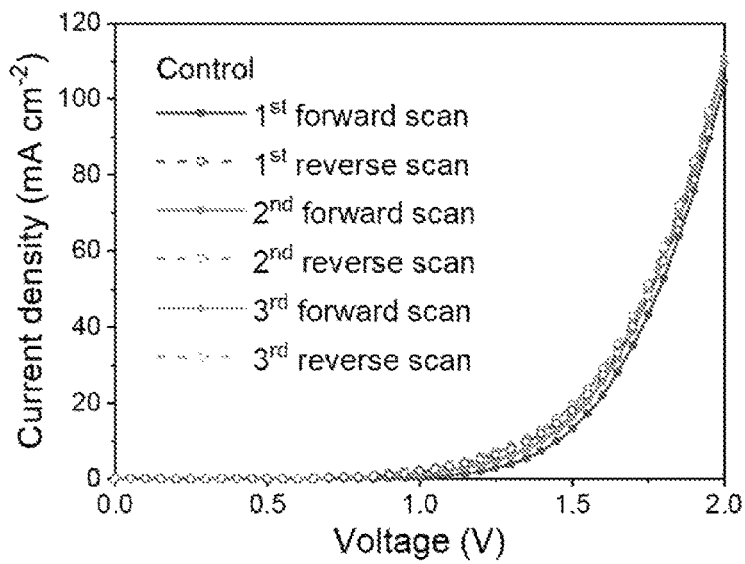
FIG. 19 is a current density-voltage relationship diagram of a perovskite device of a control group under multiple forward and reverse scans in Embodiment 1 of the present invention.

FIG. 19 shows a hysteresis characteristic relationship of the device of the control group. It can be seen from the figure that a hysteresis behavior (non-coincidence between the current density-voltage relationship and a first forward scan) is observed in the device of the control group during a first reverse scan, and the hysteresis behavior is more obvious with the increase of scanning cycles, which indicates that a stability of the device of the control group is poor.

Figure 20:
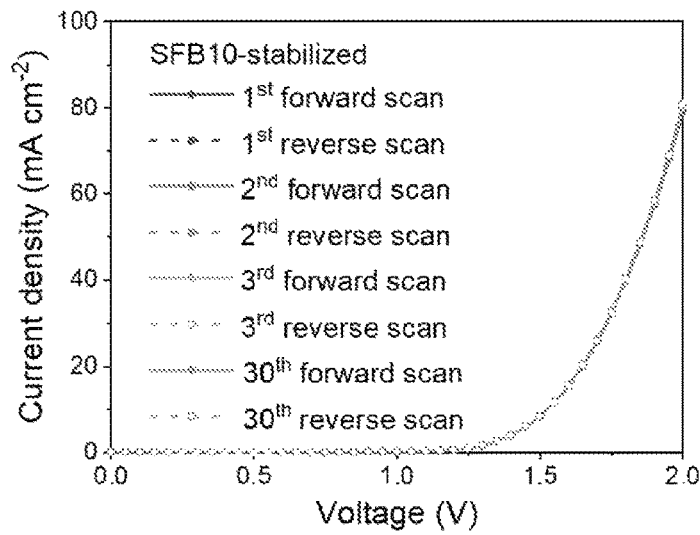
FIG. 20 is a current density-voltage relationship diagram of a perovskite device introduced with SFB10 under multiple forward and reverse scans in Embodiment 1 of the present invention.
Figure 21:
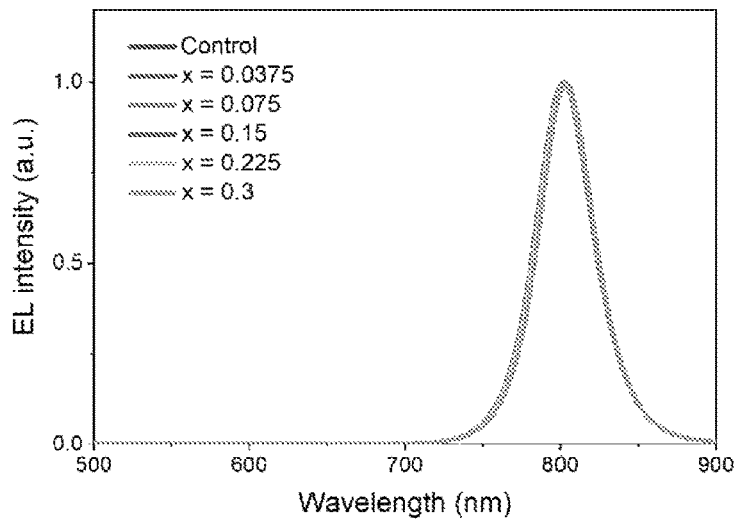
FIG. 21 shows a normalized electroluminescent intensity-wavelength relationship of the device under different stabilizer ratios in Embodiment 1 of the present invention.
Figure 22:
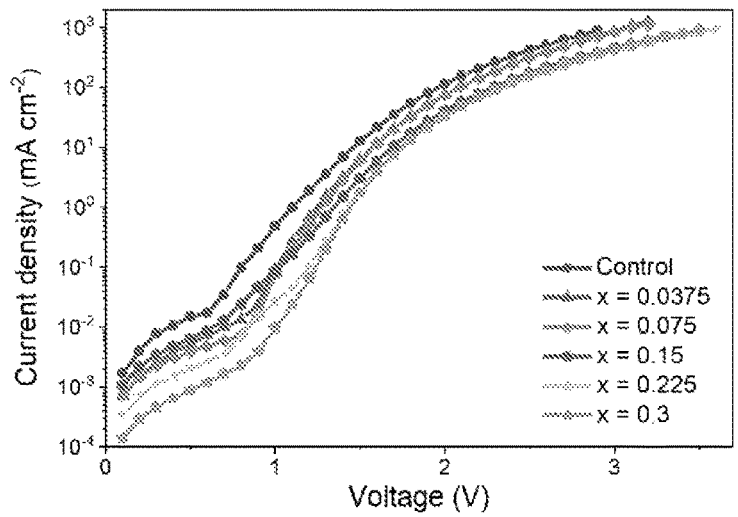
FIG. 22 is a current density-voltage relationship diagram of the device under different stabilizer ratios in Embodiment 1 of the present invention.
Figure 23:
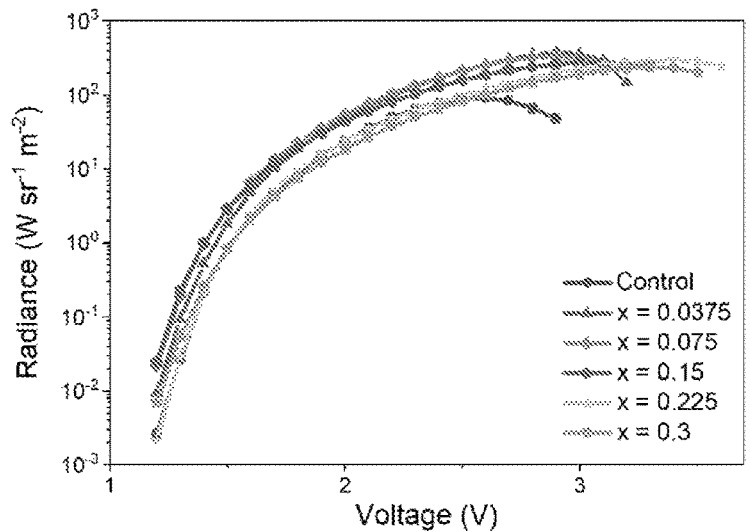
FIG. 23 is a radiance-voltage relationship diagram of the device under different stabilizer ratios in Embodiment 1 of the present invention.
Figure 24:
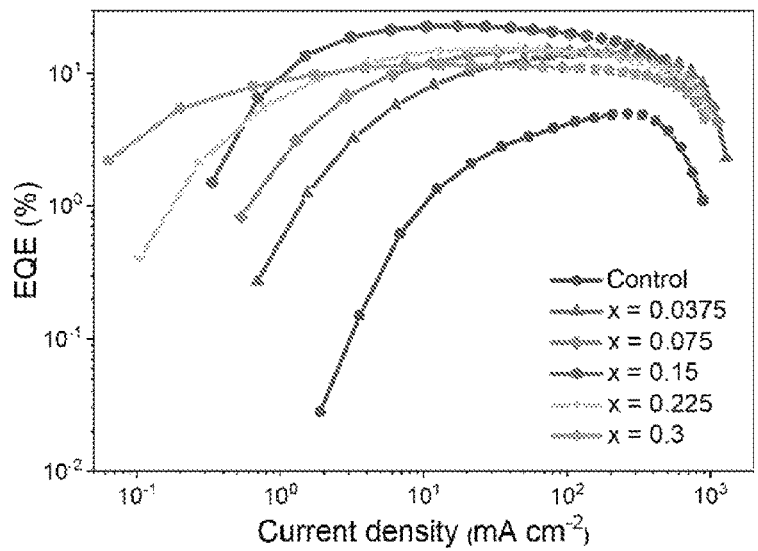
FIG. 24 is an external quantum efficiency-current density relationship diagram of the device under different stabilizer ratios in Embodiment 1 of the present invention.

FIG. 20 shows a hysteresis characteristic relationship of the device introduced with SFB10. It can be seen from the figure that, in 30 scanning cycles, observable hysteresis of SFB10-stabilized PeLEDs fails to be recorded, which indicates that a working stability of the device introduced with SFB10 is greatly enhanced.

FIG. 21, FIG. 22, FIG. 23, and FIG. 24 respectively show normalized electroluminescence spectra (EL), current density-voltage relationships, radiance-voltage relationships and external quantum efficiency-current density relationships of devices introduced with different contents of SFB10. It can be seen from the figures that, after the device is introduced with SFB10, the electroluminescent spectrum (EL) of the device is unchanged, the leakage current of the device is reduced, the radiance of the device is increased, and the external quantum efficiency of the device is increased. When the content of SFB10 is 0.15 (a molar ratio to the lead ion Pb$^{2+}$), the external quantum efficiency of the device reaches the highest of 22.8%.

Figure 25:
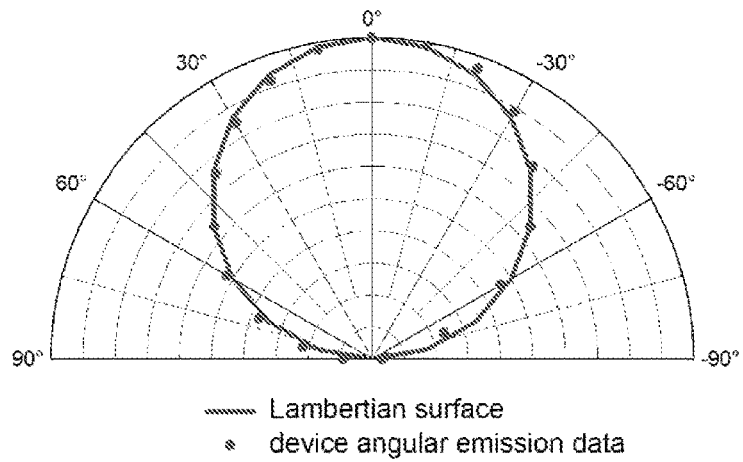
FIG. 25 is an electroluminescent angle dependence characteristic relationship diagram of the device introduced with SFB10 in Embodiment 1 of the present invention.

FIG. 25 shows an electroluminescent angle dependence characteristic relationship of the device introduced with SFB10. It can be seen from the figure that the electroluminescence spectrum of the device accords with Lambert emission characteristics.

Figure 26:
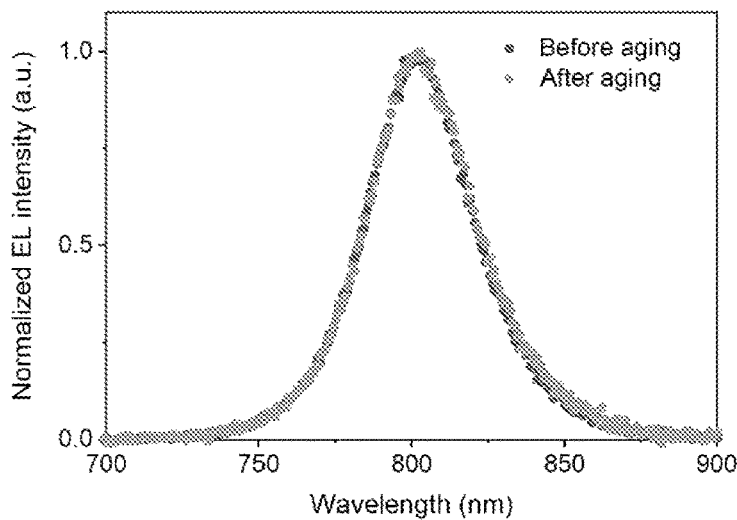
FIG. 26 shows a normalized electroluminescent intensity-wavelength relationship of the device before and after aging in Embodiment 1 of the present invention.

FIG. 26 is an EL spectrogram of the device introduced with SFB10 before and after aging under 200 mA cm$^{-2}$. It can be seen from the figure that the electroluminescent spectrum of the device after aging for 22.4 hours is consistent with the electroluminescent spectrum of the device before aging, which indicates that a spectral working stability of the perovskite device introduced with SFB10 is good.

Figure 27:
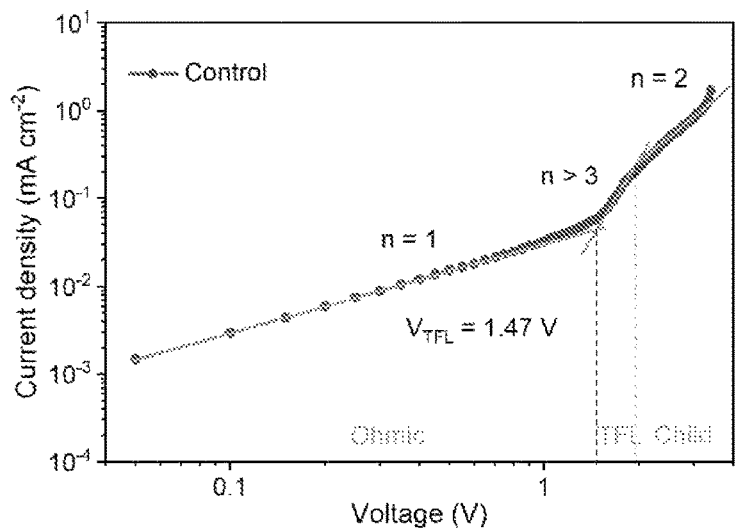
FIG. 27 is a current density-voltage relationship diagram of a single electron device of perovskite of a control group in Embodiment 1 of the present invention.
Figure 28:
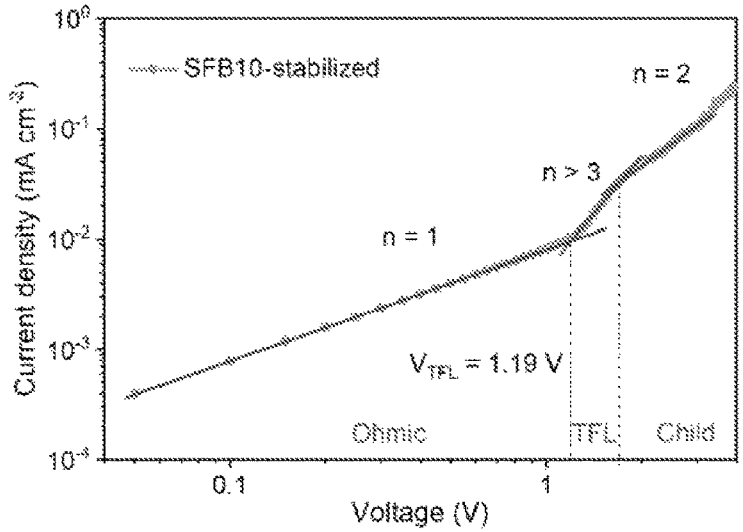
FIG. 28 is a current density-voltage relationship diagram of a single electron device of perovskite introduced with SFB10 in Embodiment 1 of the present invention.
Figure 29A:
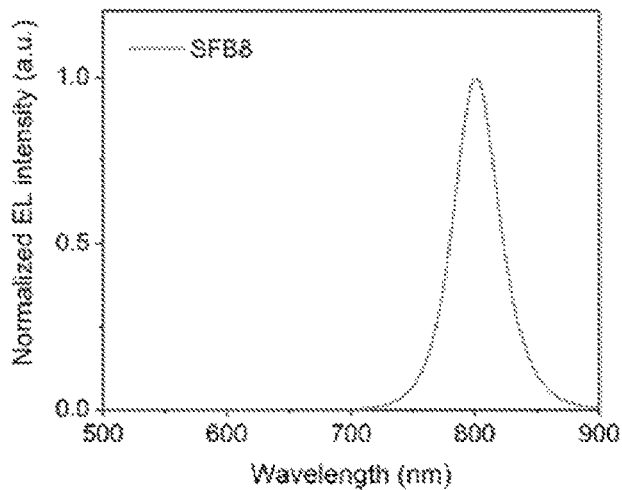
FIGS. 29A-D are a normalized electroluminescence spectrogram, a current density-voltage-radiance characteristic relationship diagram, an external quantum efficiency-current density characteristic relationship diagram and a radiance-time relationship diagram of a device in Embodiment 2 of the present invention.
Figure 29B:
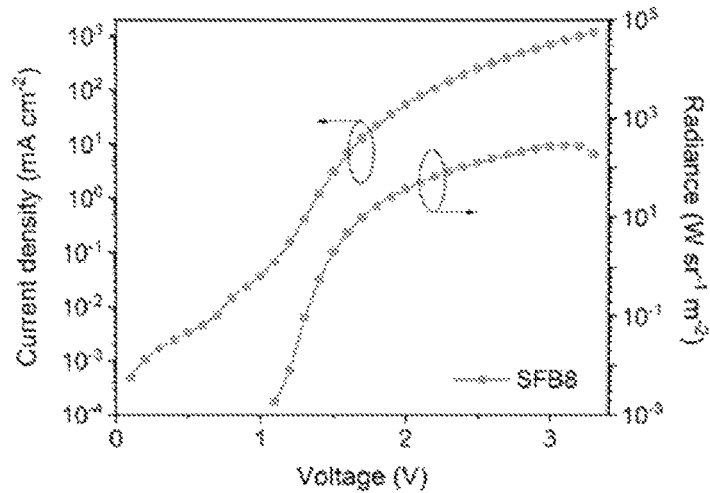
Figure 29C:
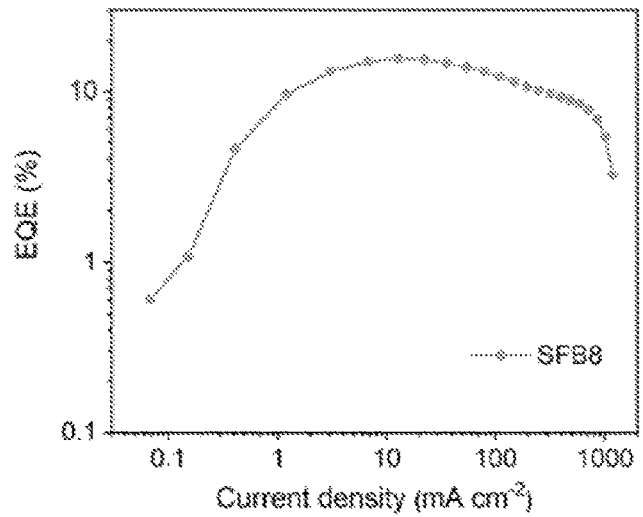
Figure 29D:
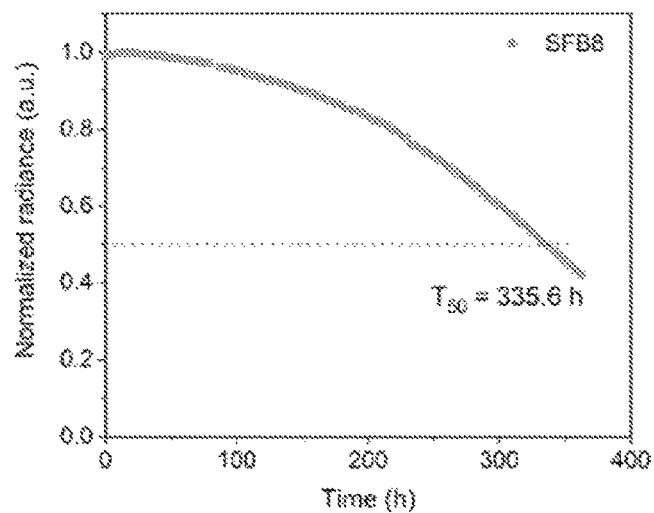
Figure 30A:
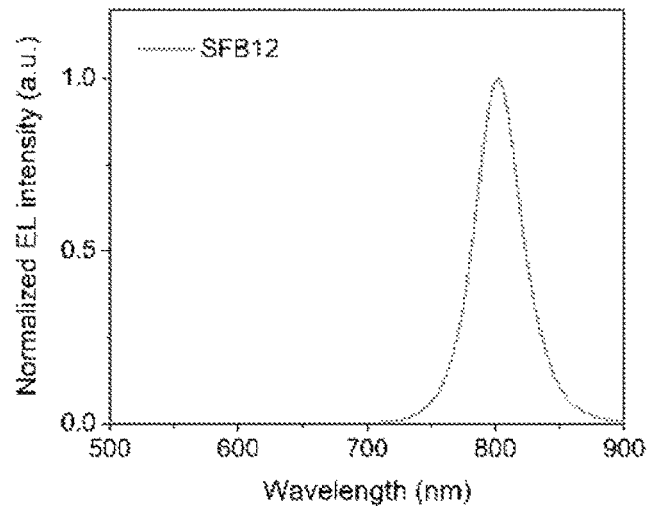
FIGS. 30A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 3 of the present invention.
Figure 30B:
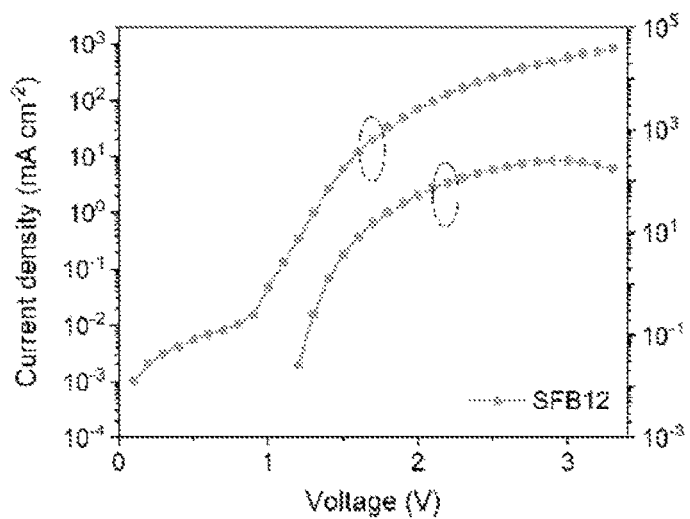
Figure 30C:
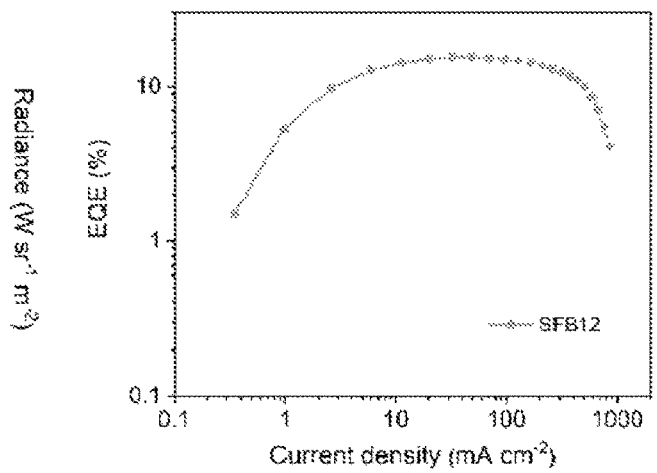
Figure 30D:
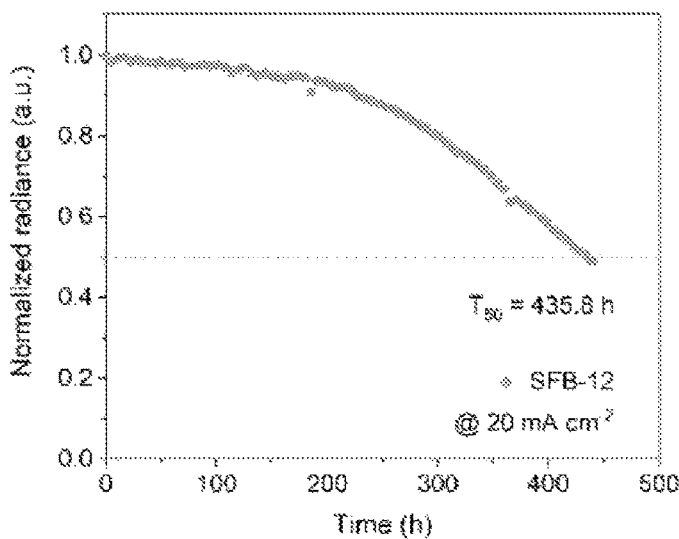
Figure 31A:
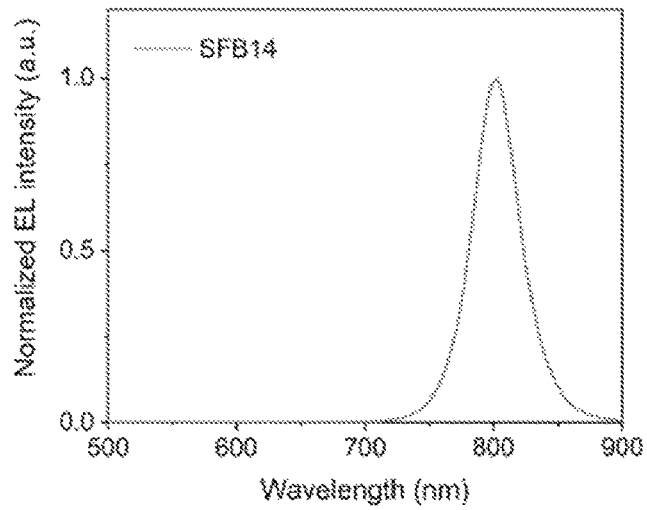
FIGS. 31A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 4 of the present invention.
Figure 31B:
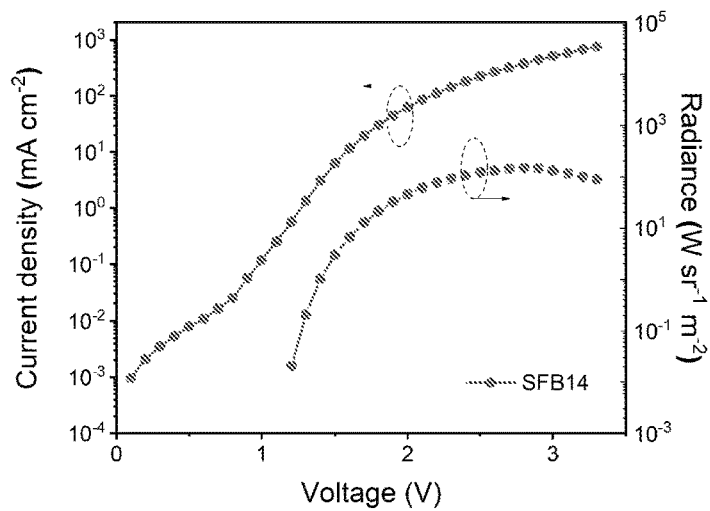
Figure 31C:
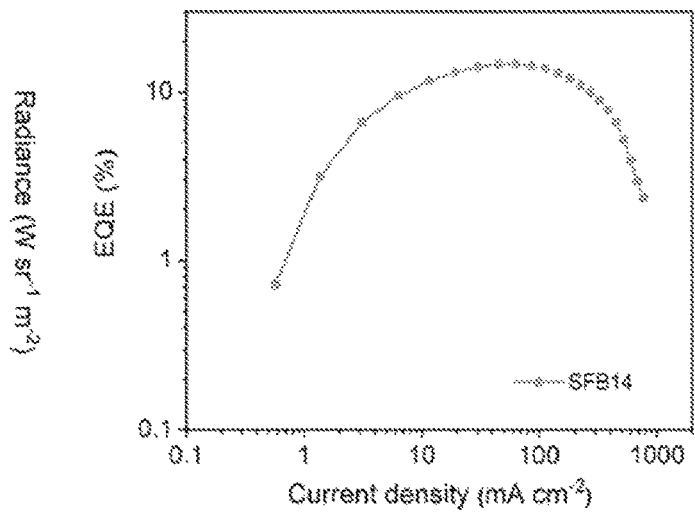
Figure 31D:
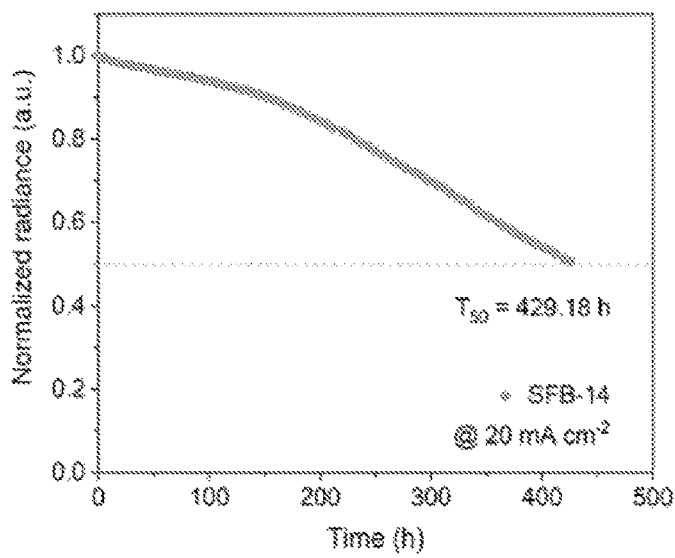
Figure 32A:
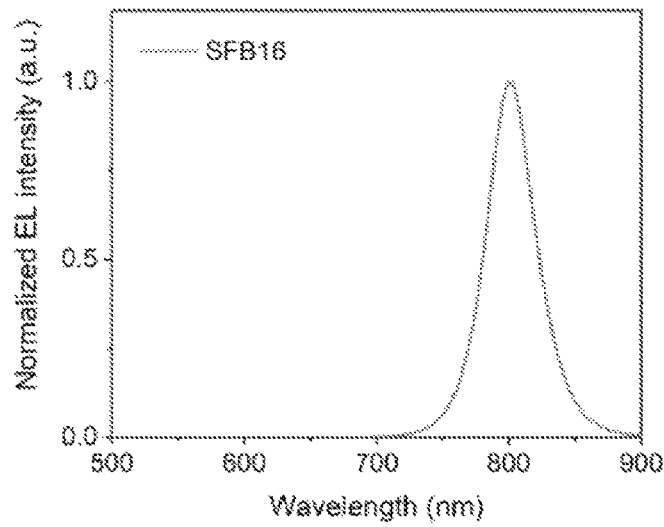
FIGS. 32A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 5 of the present invention.
Figure 32B:
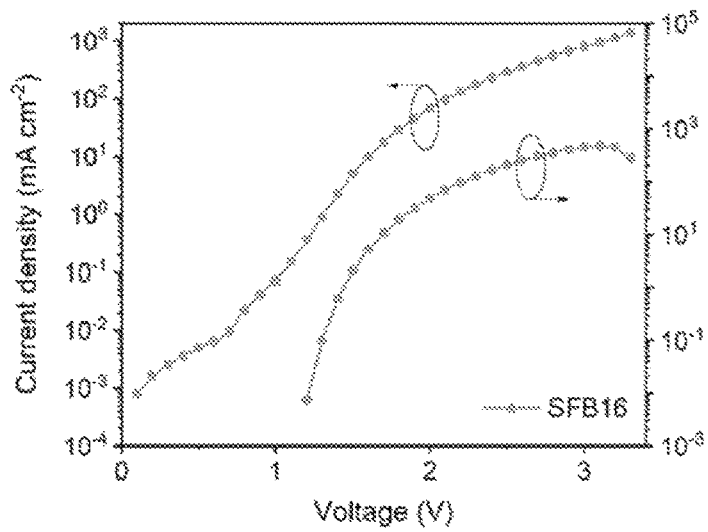
Figure 32C:
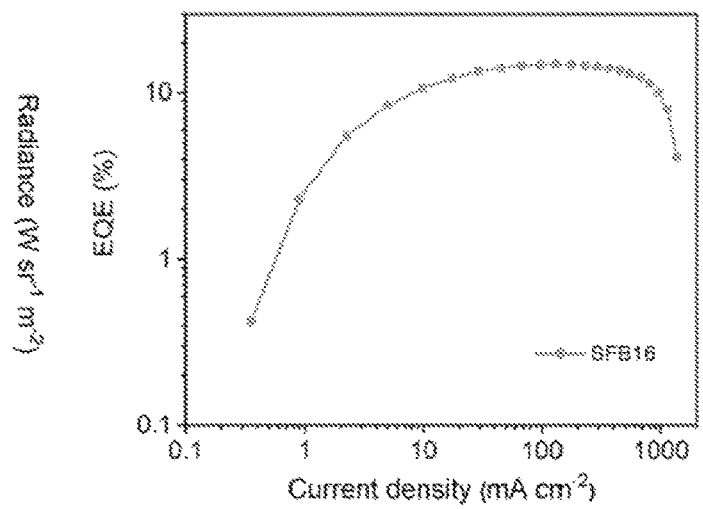
Figure 32D:
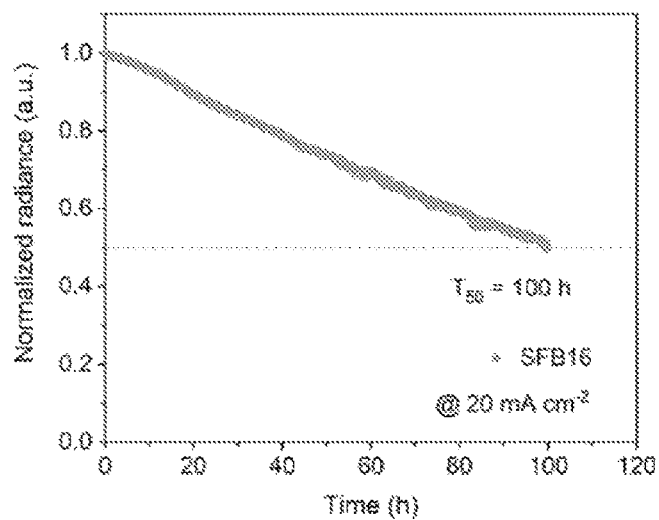
Figure 33A:
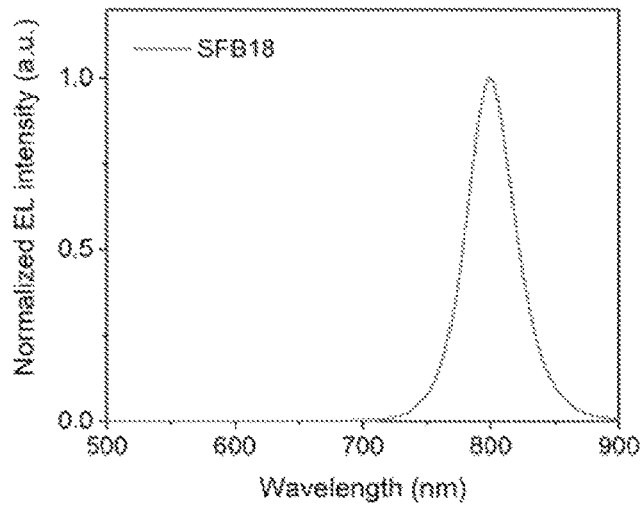
FIGS. 33A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 6 of the present invention.
Figure 33B:
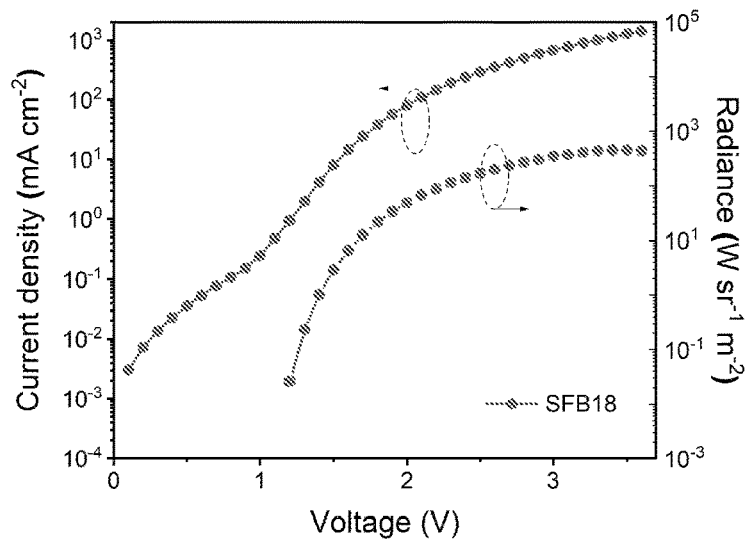
Figure 33C:
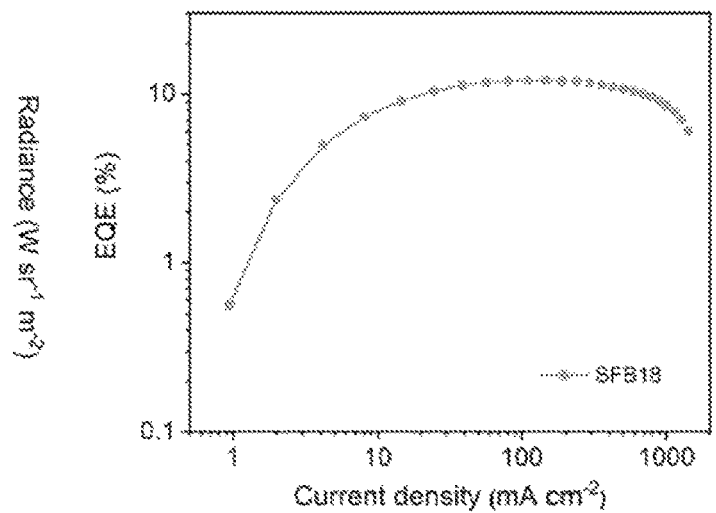
Figure 33D:
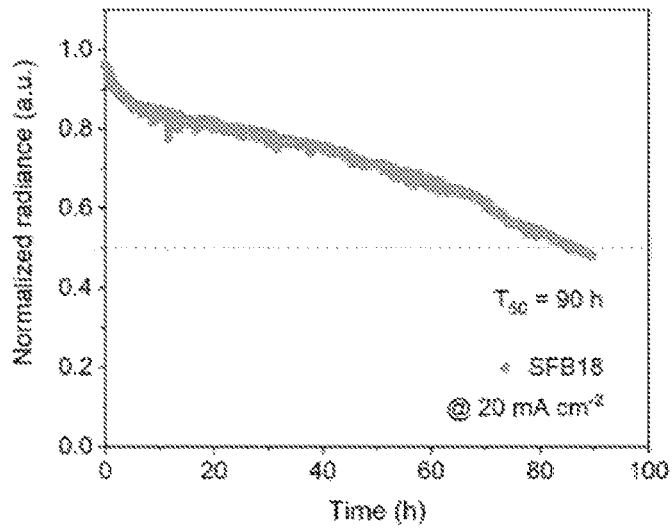
Figure 34A:
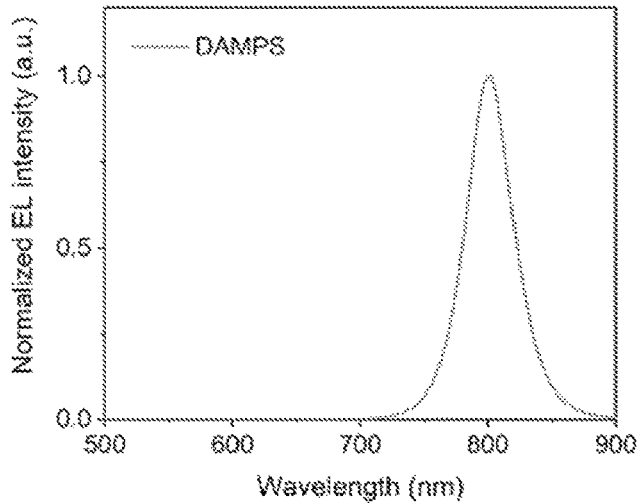
FIGS. 34A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 7 of the present invention.
Figure 34B:
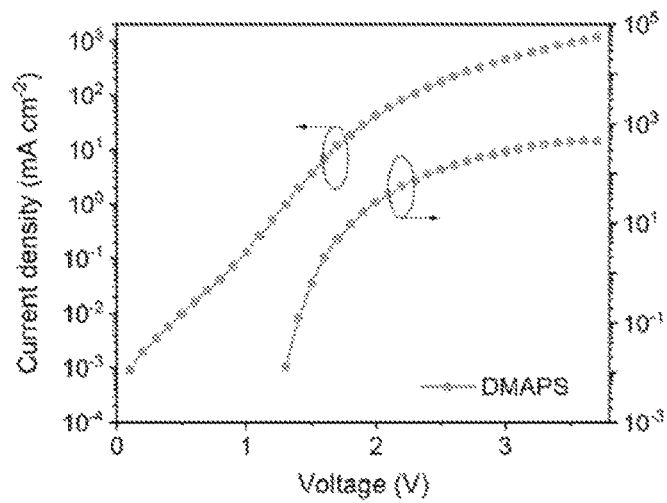
Figure 34C:
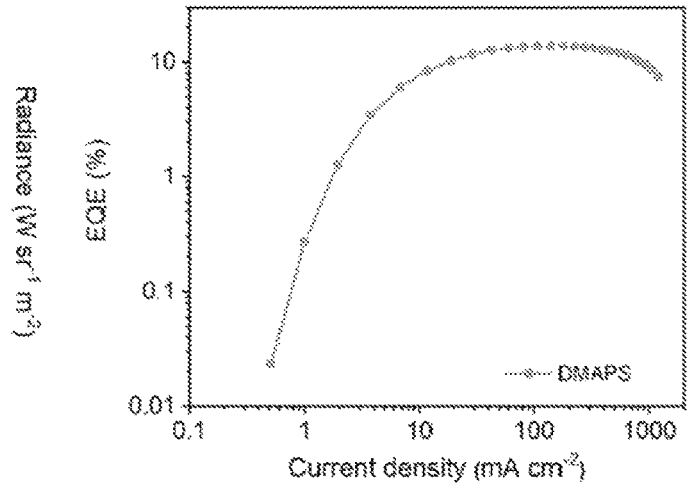
Figure 34D:
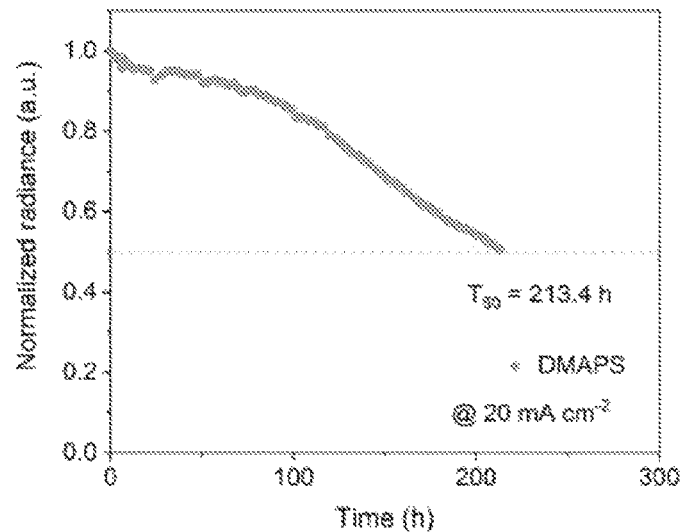
Figure 35A:
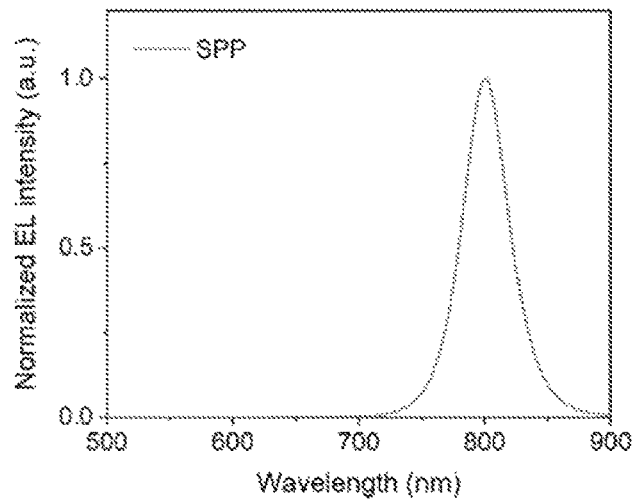
FIGS. 35A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 8 of the present invention.
Figure 35B:
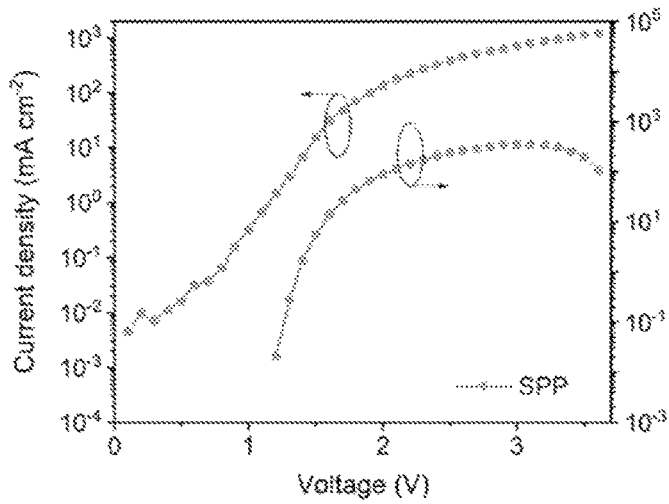
Figure 35C:
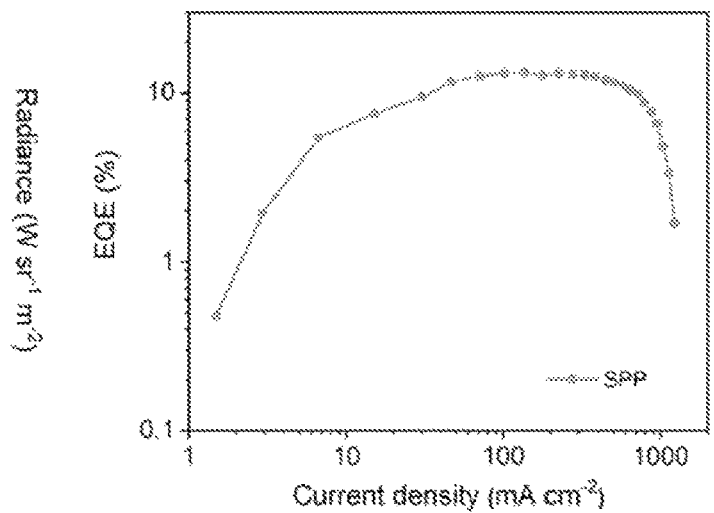
Figure 35D:
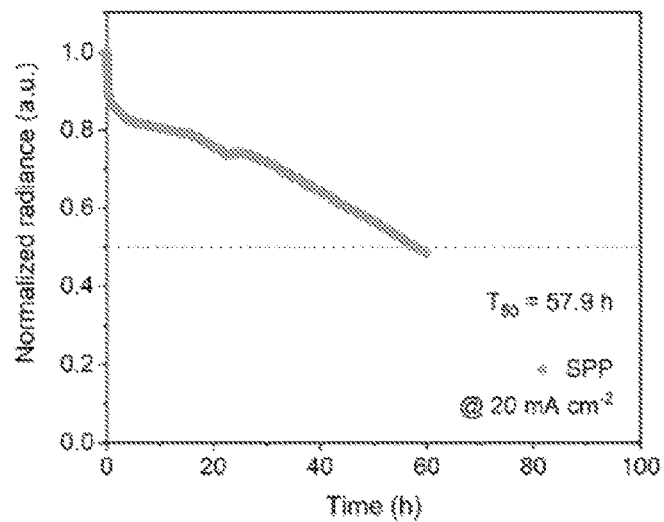
Figure 36A:
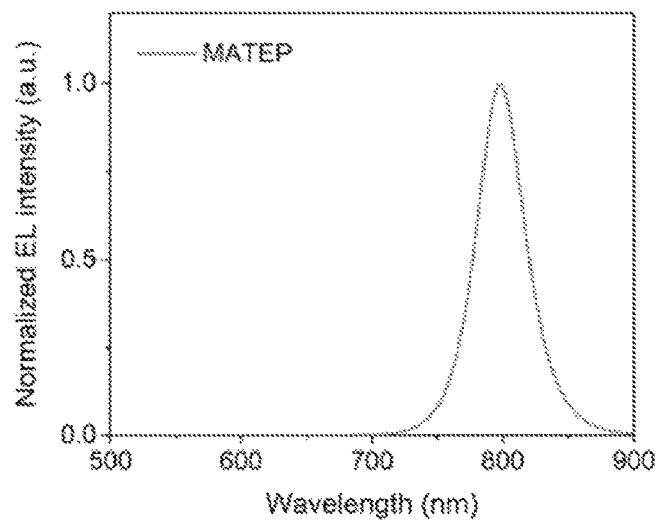
FIGS. 36A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 9 of the present invention.
Figure 36B:
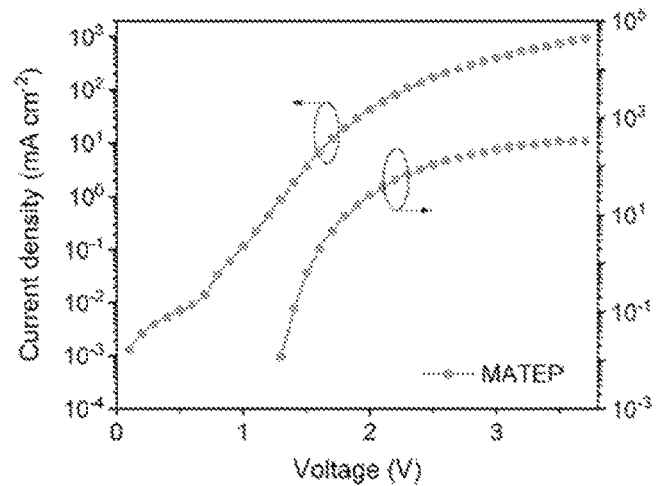
Figure 36C:
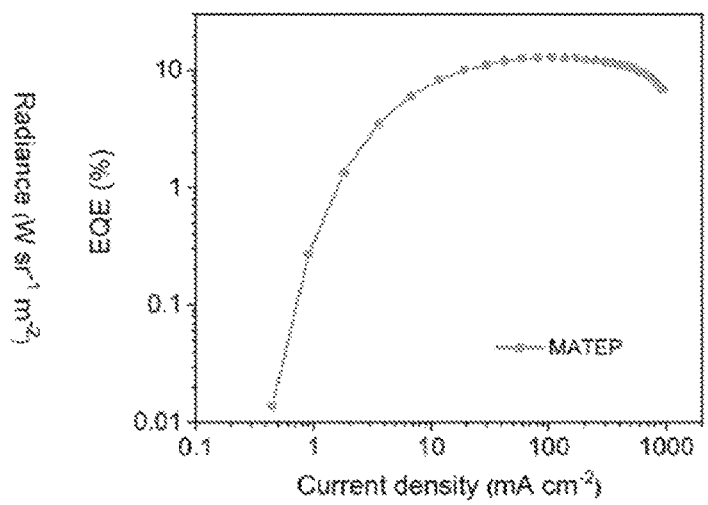
Figure 36D:
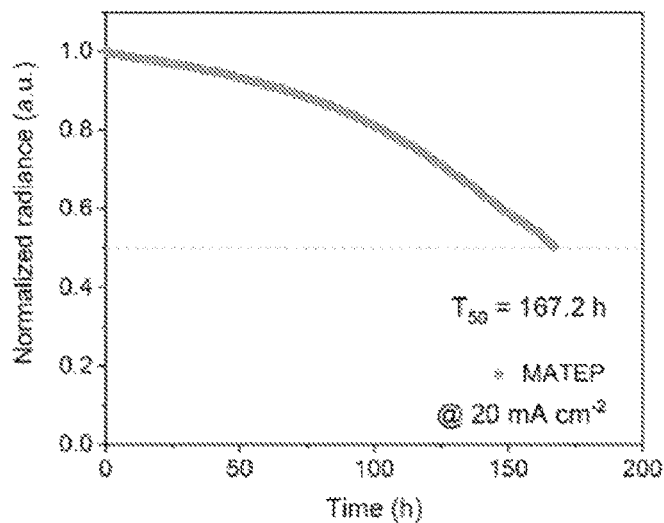
Figure 37A:
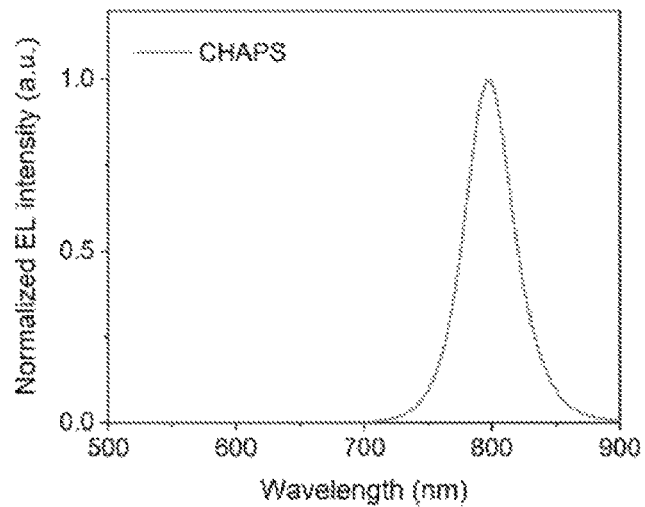
FIGS. 37A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 10 of the present invention.
Figure 37B:
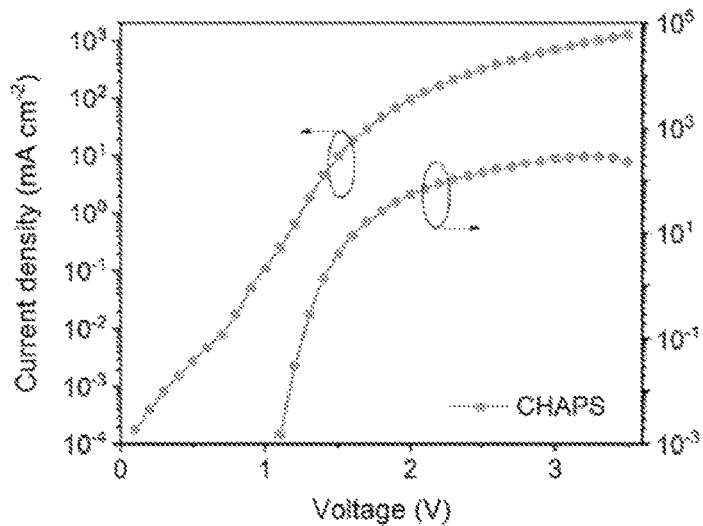
Figure 37C:
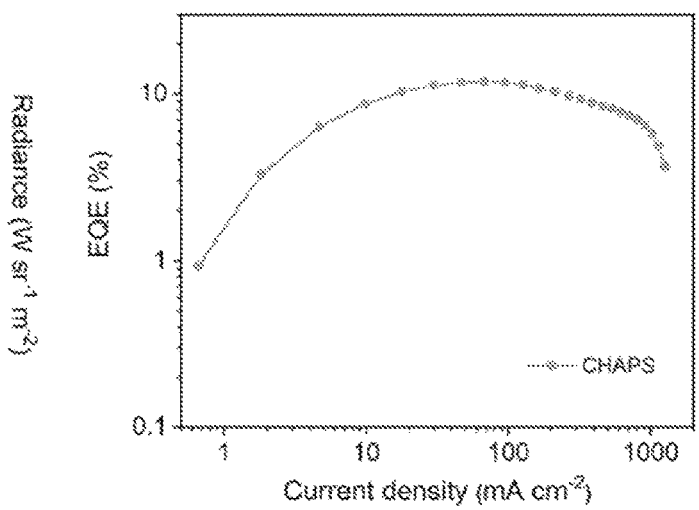
Figure 37D:
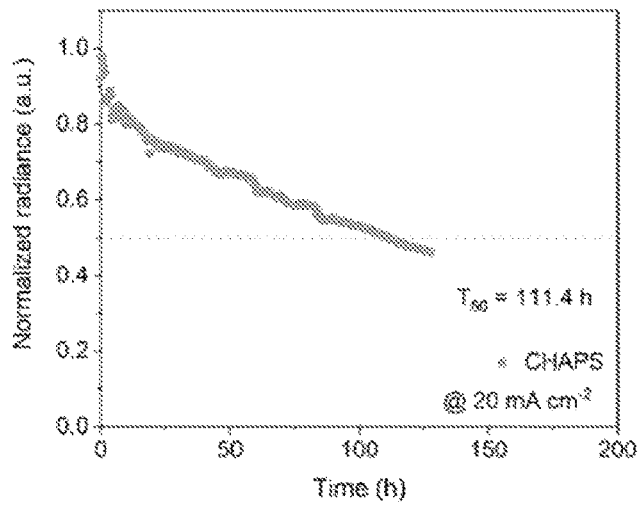
Figure 38A:
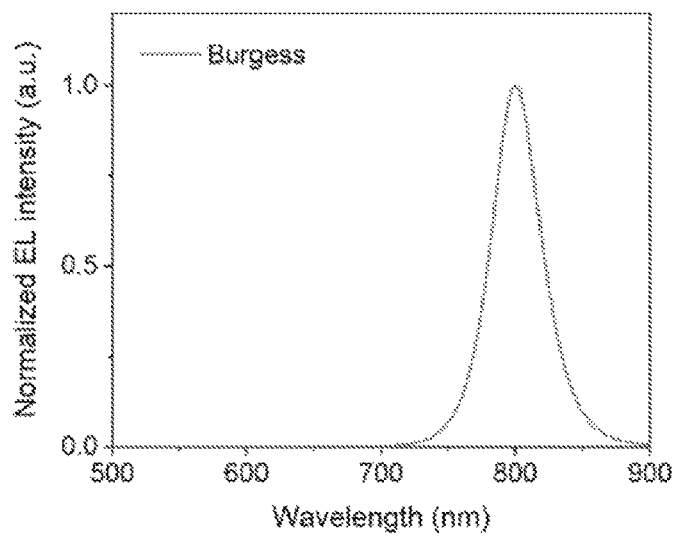
FIGS. 38A-D are a normalized electroluminescence spectrogram, a current density-voltage-radiance characteristic relationship diagram, a normalized external quantum efficiency-current density characteristic relationship diagram and a radiance-time relationship diagram of a device in Embodiment 11 of the present invention.
Figure 38B:
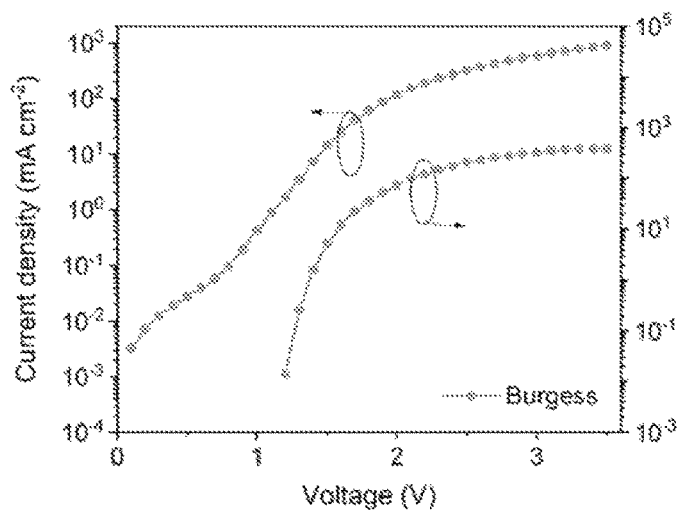
Figure 38C:
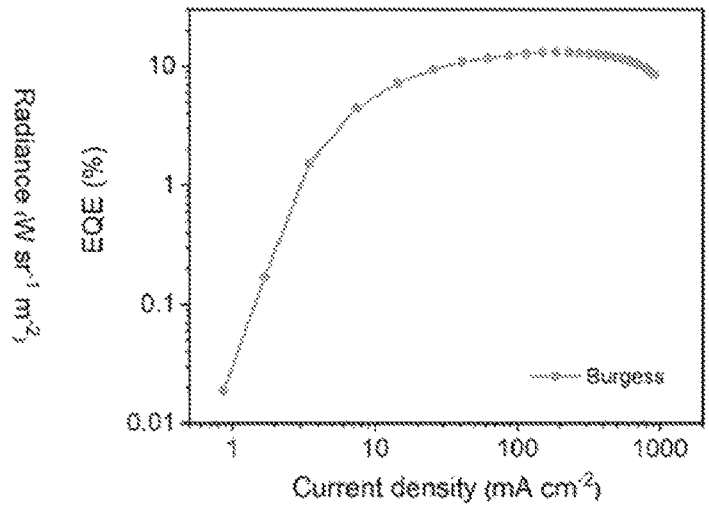
Figure 38D:
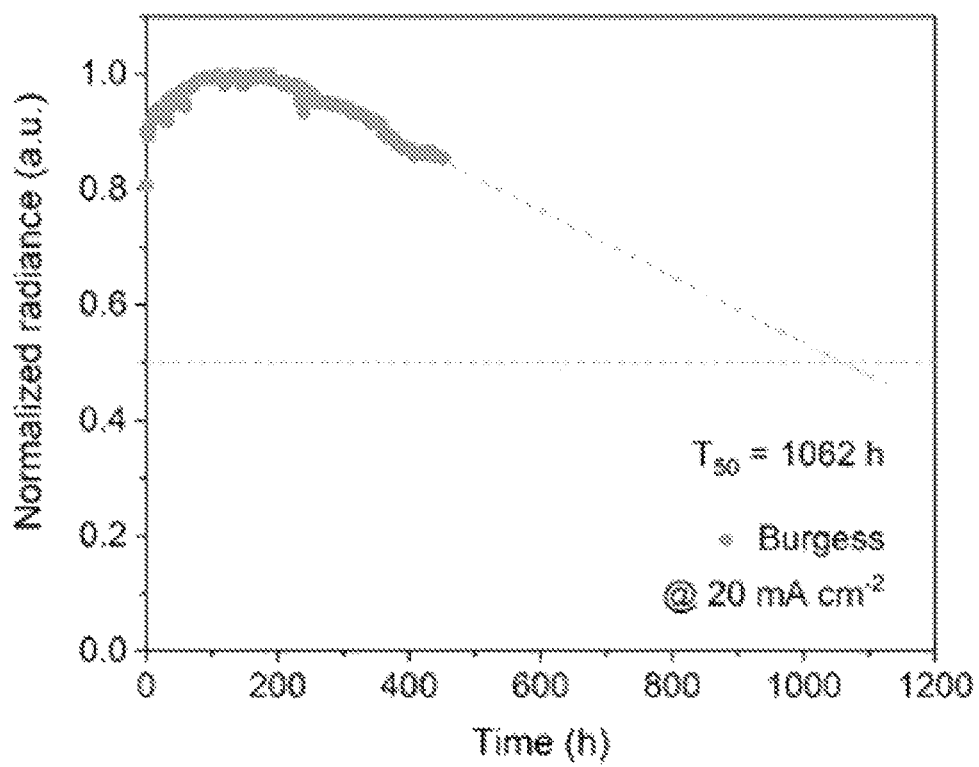

FIG. 27 and FIG. 28 show current density-voltage characteristic relationships of a single electron device of a control group and a single electron device introduced with SFB10. Generally, we can compare defect state densities of materials in the luminescent material through a threshold voltage ($V_{TFL}$). It can be seen from the figures that a threshold voltage of the single electron device of the control group is 1.47 V, and a threshold voltage of the single electron device introduced with SFB10 is 1.19 V, so that it can be seen that the defect state density in the perovskite material introduced with SFB10 is reduced.

2. Embodiment 2 Preparation of Novel Stable and Efficient Perovskite Light-Emitting Diode (with Dipolar Molecular Stabilizer Changed from SFB10 into SFB8)

An ITO glass substrate, a ZnO electron transport layer and a PEIE modified layer were adopted, a perovskite precursor solution was dissolved in 1 mL of DMF according to a molar ratio of FAI:PbI$_2$:SFB8=2:1:x (x=0-0.5) to prepare 0.13 M solution, and subjected to spin coating at 5,000 rpm, and about 5 seconds after starting the spin coating process, 100 μL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 29A-D show an electroluminescence spectrum, a current density-voltage-radiance characteristic relationship and an external quantum efficiency-current density characteristic relationship of the perovskite device introduced with SFB8, and a radiance-time characteristic relationship of the device under 20 mA cm$^{-2}$. It can be seen from the figure that the external quantum efficiency of the device introduced with SFB8 is 16.5%, and a T$_{50}$ lifetime of the device under 20 mA cm$^{-2}$ is 333.6 hours, which indicates that the external quantum efficiency and the working stability of the device introduced with SFB8 are both improved.

3. Embodiment 3 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:Pb$_1$2:SFB12=2:1:x (x=0-0.5) to prepare 0.13 M solution, and subjected to spin coating at 5,000 rpm, and about 5 seconds after starting the spin coating process, 100 μL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 30A-D show an electroluminescence spectrum, a current density-voltage-radiance characteristic relationship and an external quantum efficiency-current density characteristic relationship of the perovskite device introduced with SFB12, and a radiance-time characteristic relationship of the device under 20 mA cm$^{-2}$. It can be seen from the figure that the external quantum efficiency of the device introduced with SFB12 is 15.5%, and a T$_{50}$ lifetime of the device under 20 mA cm$^{-2}$ is 435.8 hours, which indicates that the external quantum efficiency and the working stability of the device introduced with SFB12 are both improved.

4. Embodiment 4 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:PbI$_2$:SFB14=2:1:x (x=0-0.5) to prepare 0.13 M solution, and subjected to spin coating at 5,000 rpm, and about 5 seconds after starting the spin coating process, 100 μL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 31A-D show an electroluminescence spectrum, a current density-voltage-radiance characteristic relationship and an external quantum efficiency-current density characteristic relationship of the perovskite device introduced with SFB14, and a radiance-time characteristic relationship of the device under 20 mA cm$^{-2}$. It can be seen from the figure that the external quantum efficiency of the device introduced with SFB14 is 14.6%, and a T$_{50}$ lifetime of the device under 20 mA cm$^{-2}$ is 429.2 hours, which indicates that the external quantum efficiency and the working stability of the device introduced with SFB14 are both improved.

5. Embodiment 5 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:PbI$_2$:SFB16=2:1:x (x=0-0.5) to prepare 0.13 M solution, and subjected to spin coating at 5,000 rpm, and about 5 seconds after starting the spin coating process, 100 μL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 32A-D show an electroluminescence spectrum, a current density-voltage-radiance characteristic relationship and an external quantum efficiency-current density characteristic relationship of the perovskite device introduced with SFB16, and a radiance-time characteristic relationship of the device under 20 mA cm$^{-2}$. It can be seen from the figure that the external quantum efficiency of the device introduced with SFB16 is 14.6%, and a T$_{50}$ lifetime of the device under 20 mA cm$^{-2}$ is 100 hours, which indicates that the external quantum efficiency and the stability of the device introduced with SFB16 are both improved.

6. Embodiment 6 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:PbI$_2$:SFB18=2:1:x (x=0-0.5) to prepare 0.13 M solution, and subjected to spin coating at 5,000 rpm, and about 5 seconds after starting the spin coating process, 100 µL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 33A-D show an electroluminescence spectrum, a current density-voltage-radiance characteristic relationship and an external quantum efficiency-current density characteristic relationship of the perovskite device introduced with SFB18, and a radiance-time characteristic relationship of the device under 20 mA cm$^{-2}$. It can be seen from the figure that the external quantum efficiency of the device introduced with SFB18 is 14.9%, and a T$_{50}$ lifetime of the device under 20 mA cm$^{-2}$ is 90 hours, which indicates that the external quantum efficiency and the stability of the device introduced with SFB18 are both improved.

7. Embodiment 7 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:PbI$_2$:DAMPS=2:1:x (x=0-0.5) to prepare 0.13 M solution, and subjected to spin coating at 5,000 rpm, and about 5 seconds after starting the spin coating process, 100 µL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 34A-D show an electroluminescence spectrum, a current density-voltage-radiance characteristic relationship and an external quantum efficiency-current density characteristic relationship of the perovskite device introduced with DAMPS, and a radiance-time characteristic relationship of the device under 20 mA cm$^{-2}$. It can be seen from the figure that the external quantum efficiency of the device introduced with DAMPS is 13.8%, and a T$_{50}$ lifetime of the device under 20 mA cm$^{-2}$ is 213.4 hours, which indicates that the external quantum efficiency and the stability of the device introduced with DAMPS are both improved.

8. Embodiment 8 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:PbI$_2$:SPP=2:1:x (x=0-0.5) to prepare 0.13 M solution, and subjected to spin coating at 5,000 rpm, and about 5 seconds after starting the spin coating process, 100 µL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 35A-D show an electroluminescence spectrum, a current density-voltage-radiance characteristic relationship and an external quantum efficiency-current density characteristic relationship of the perovskite device introduced with SPP, and a radiance-time characteristic relationship of the device under 20 mA cm$^{-2}$. It can be seen from the figure that the external quantum efficiency of the device introduced with DAMPS is 13.2%, and a T$_{50}$ lifetime of the device under 20 mA cm$^{-2}$ is 57.9 hours, which indicates that the external quantum efficiency and the stability of the device introduced with DAMPS are both improved.

9. Embodiment 9 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:PbI$_2$:CHAPS=2:1:x (x=0-0.5) to prepare 0.13 M solution, and subjected to spin coating at 5,000 rpm, and about 5 seconds after starting the spin coating process, 100 µL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 36A-D show an electroluminescence spectrum, a current density-voltage-radiance characteristic relationship and an external quantum efficiency-current density characteristic relationship of the perovskite device introduced with CHAPS, and a radiance-time characteristic relationship of the device under 20 mA cm$^{-2}$. It can be seen from the figure that the external quantum efficiency of the device introduced with CHAPS is 11.8%, and a T$_{50}$ lifetime of the device under 20 mA cm$^{-2}$ is 111.4 hours, which indicates that the external quantum efficiency and the stability of the device introduced with CHAPS are both improved.

10. Embodiment 10 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:PbI$_2$:MATEP=2:1:x (x=0-0.5) to prepare 0.13 M solution, and subjected to spin coating at 5,000 rpm, and about 5 seconds after starting the spin coating process, 100 µL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 37A-D show an electroluminescence spectrum, a current density-voltage-radiance characteristic relationship and an external quantum efficiency-current density characteristic relationship of the perovskite device introduced with MATEP, and a radiance-time characteristic relationship of the device under 20 mA cm$^{-2}$. It can be seen from the figure that the external quantum efficiency of the device introduced with MATEP is 12.9%, and a T$_{50}$ lifetime of the device under 20 mA cm$^{-2}$ is 167.2 hours, which indicates that the external quantum efficiency and the stability of the device introduced with MATEP are both improved.

11. Embodiment 11 Preparation of Novel Stable and Efficient Perovskite Light-Emitting Diode An ITO glass substrate, a ZnO electron transport layer and a PEIE modified layer were adopted, a perovskite precursor solution was dissolved in 1 mL of DMF according to a molar ratio of FAI:PbI$_2$:Burgess=2:1:x (x=0-0.5) to prepare 0.13 M solution, and subjected to spin coating at 5,000 rpm, and about 5 seconds after starting the spin coating process, 100 µL of chlorobenzene was dropwise added on a sample, and annealed at 100° C. for 10 minutes after finishing the spin coating to obtain a perovskite material. A hole transport layer was TFB, and an electrode was MoO$_x$/Au.

FIGS. 38A-D show an electroluminescence spectrum, a current density-voltage-radiance characteristic relationship and an external quantum efficiency-current density characteristic relationship of the perovskite device introduced with Burgess, and a radiance-time characteristic relationship of the device under 20 mA cm$^{-2}$. It can be seen from the figure that the external quantum efficiency of the device introduced with Burgess is 13.1%, and a $T_{50}$ lifetime of the device under 20 mA cm$^{-2}$ is 1062 hours, which indicates that the external quantum efficiency and the stability of the device introduced with Burgess are both improved.

12. Embodiment 12 Preparation of Novel Stable and Efficient Perovskite Material An ITO Glass substrate was adopted, a perovskite precursor solution was dissolved in 1 mL of DMF according to a molar ratio of PEAI:PbI$_2$:SFB10=2:1:x (x=0-0.5) to prepare 0.3 M solution, and subjected to spin coating at 5,000 rpm, and about 5 seconds after starting the spin coating process, 100 L of chlorobenzene was dropwise added on a sample, and annealed at 100° C. for 4 minutes after finishing the spin coating to obtain a perovskite material.

Figure 39:
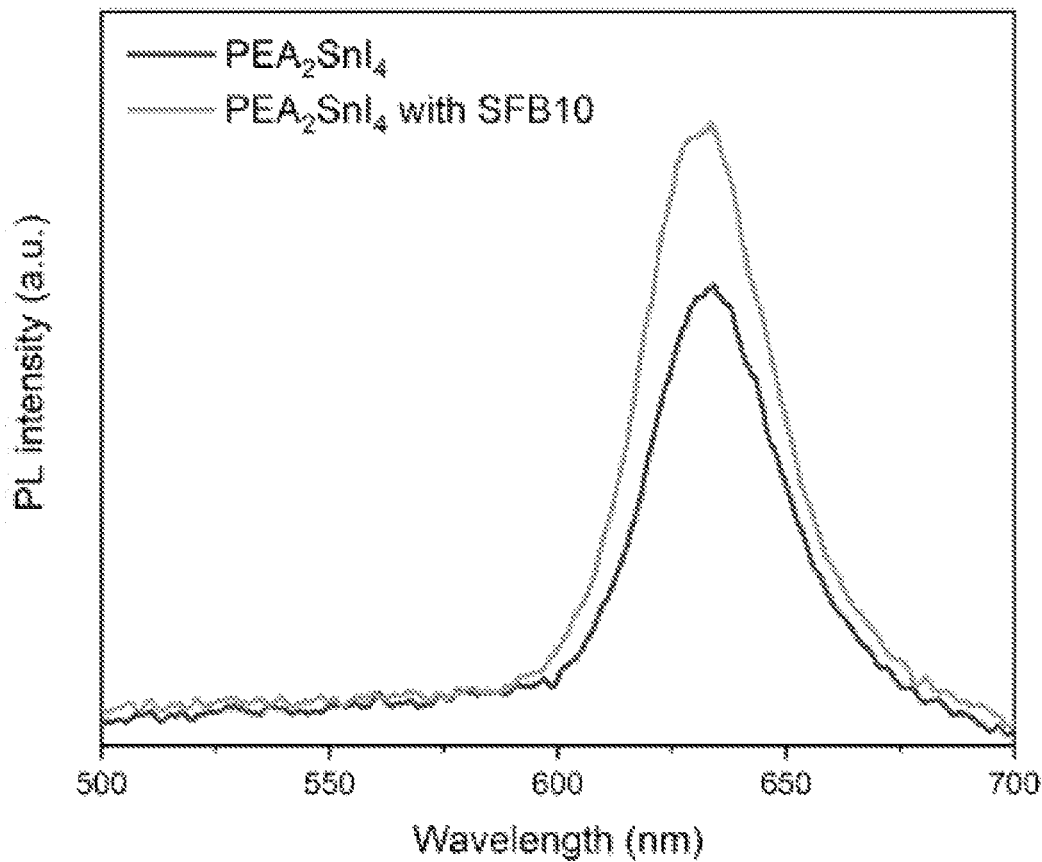
FIG. 39 is a photoluminescent intensity-wavelength characteristic diagram of a material in Embodiment 12 of the present invention.

FIG. 39 is a photoluminescent intensity-wavelength relationship diagram of a red-light PEA$_2$SnI$_4$ material introduced with SFB10. It can be seen from the figure that the introduction of SFB10 improves the photoluminescent intensity of the material, which indicates that SFB10 can reduce a defect state density of two-dimensional tin-based perovskite.

13. Embodiment 13 Preparation of Novel Stable and Efficient Perovskite Light-Emitting Diode An ITO glass substrate was adopted, a perovskite precursor solution was dissolved in 1 mL of DMSO according to a molar ratio of FABr:CsBr:PbBr$_2$:SFB10=0.2:1:1:x (x=0-0.5) to prepare 0.3 M solution, subjected to spin coating at 5,000 rpm, and annealed at 70° C. for 2 minutes after finishing the spin coating to obtain a perovskite material.

Figure 40:
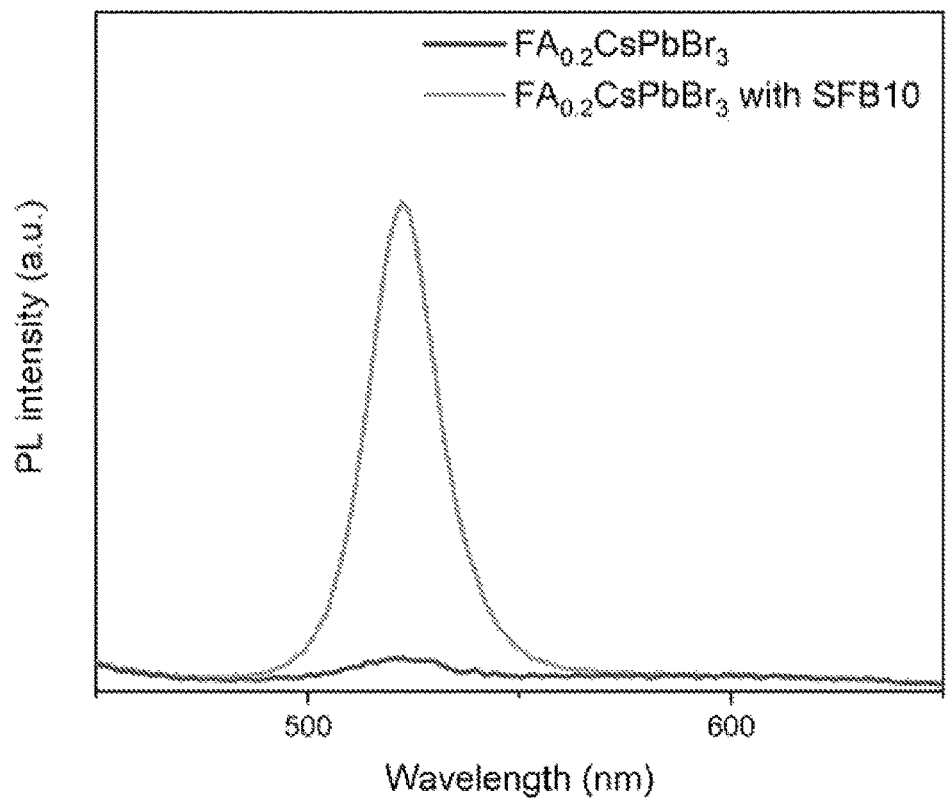
FIG. 40 is a photoluminescent intensity-wavelength characteristic diagram of a material in Embodiment 13 of the present invention.

FIG. 40 is a photoluminescent intensity-wavelength relationship diagram of a three-dimensional green-light FA$_{0.2}$CsPbBr$_3$ material introduced with SFB10. It can be seen from the figure that the introduction of SFB10 greatly improves the photoluminescent intensity of the material, which indicates that SFB10 can reduce a defect state density of three-dimensional green-light perovskite.

14. Embodiment 14 Preparation of Novel Stable and Efficient Perovskite Light-Emitting Diode An ITO glass substrate was adopted, a perovskite precursor solution was dissolved in 1 mL of DMSO according to a molar ratio of MOPEABr:FABr:CsBr:PbBr$_2$:SFB10=0.4:0.2:1:1:x (x=0-0.5) to prepare 0.3 M solution, subjected to spin coating at 5,000 rpm, and annealed at 70° C. for 2 minutes after finishing the spin coating to obtain a perovskite material.

Figure 41:
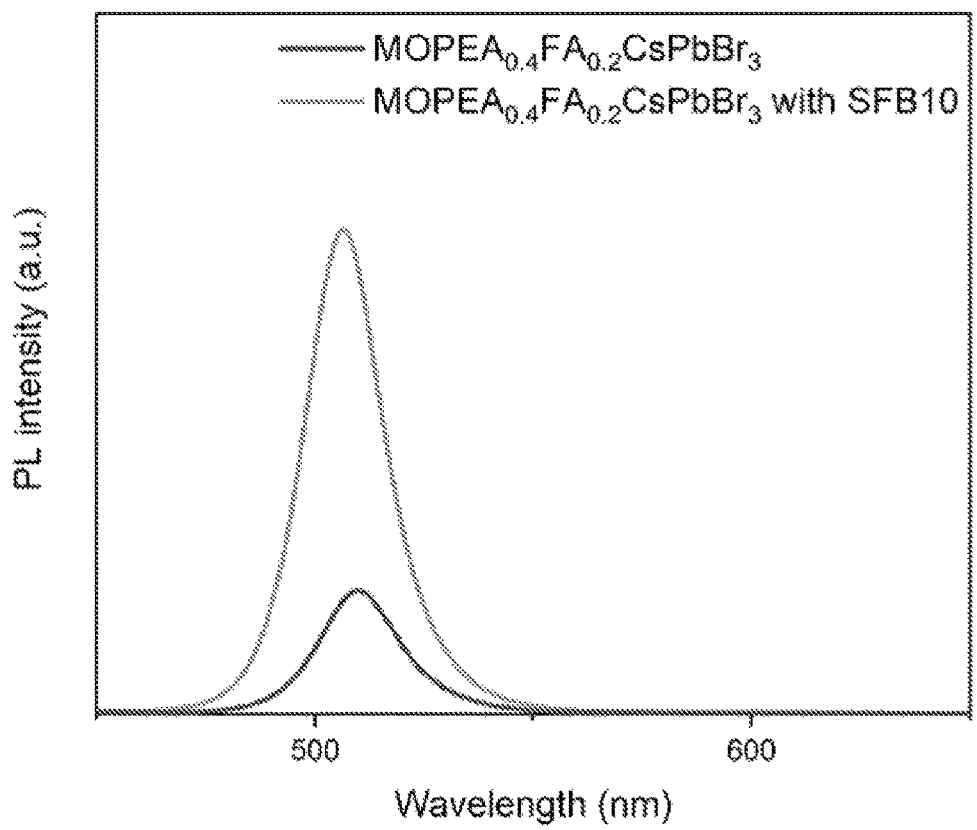
FIG. 41 is a photoluminescent intensity-wavelength characteristic diagram of a material in Embodiment 14 of the present invention.

FIG. 41 is a photoluminescent intensity-wavelength relationship diagram of a quasi-two-dimensional green-light MOPEA$_{0.4}$-FA$_{0.2}$CsPbBr$_3$ material introduced with SFB10. It can be seen from the figure that the introduction of SFB10 greatly improves the photoluminescent intensity of the material, which indicates that SFB10 can reduce a defect state density of quasi-two-dimensional green-light perovskite.

15. Embodiment 15 Preparation of Novel Stable and Efficient Perovskite Light-Emitting Diode An ITO glass substrate was adopted, a perovskite precursor solution was dissolved in 1 mL of DMSO according to a molar ratio of NMAI:CsI:PbI$_2$:SFB10=1:1:1:x (x=0-0.5) to prepare 0.1 M solution, subjected to spin coating at 5,000 rpm, and annealed at 100° C. for 10 minutes after finishing the spin coating to obtain a perovskite material.

Figure 42:
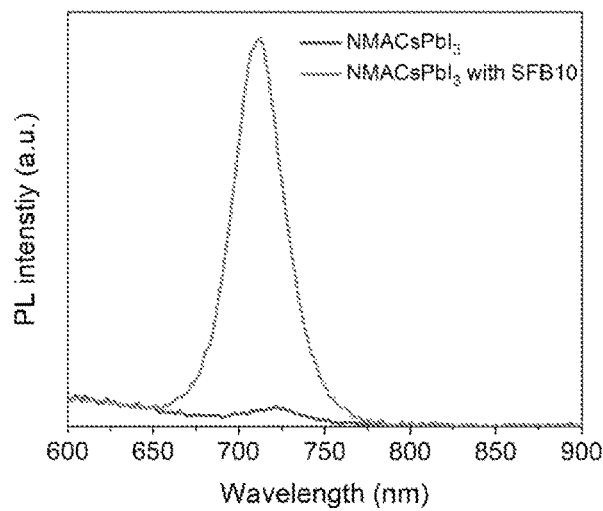
FIG. 42 is a photoluminescent intensity-wavelength characteristic diagram of a material in Embodiment 15 of the present invention.

FIG. 42 is a photoluminescent intensity-wavelength relationship diagram of a quasi-two-dimensional red-light NMA-CsPbI$_3$ material introduced with SFB10. It can be seen from the figure that the introduction of SFB10 greatly improves the photoluminescent intensity of the material, which indicates that SFB10 can reduce a defect state density of quasi-two-dimensional red-light perovskite.

16. Embodiment 16 Preparation of Novel Stable and Efficient Perovskite Light-Emitting Diode An ITO glass substrate was adopted, a perovskite precursor solution was dissolved in 1 mL of DMSO according to a molar ratio of PBABr:FABr:CsBr:PbBr$_2$:SFB10=1.1:0.3:0.7:1:x (x=0-0.5) to prepare 0.07 M solution, subjected to spin coating at 5,000 rpm, and annealed at 70° C. for 10 minutes after finishing the spin coating to obtain a perovskite material.

Figure 43:
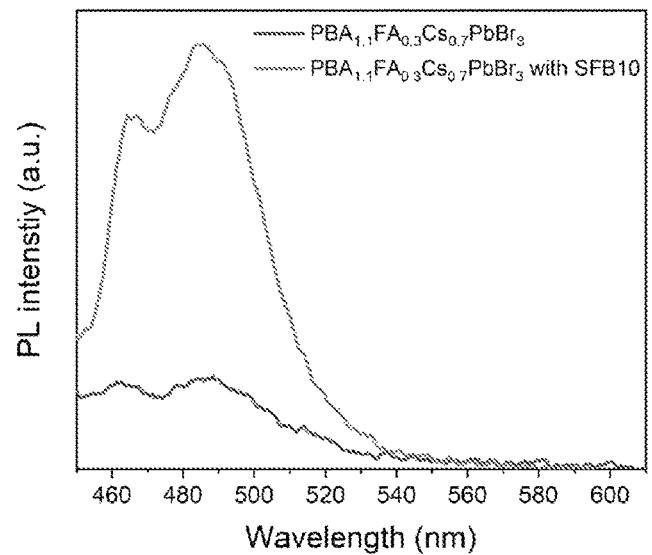
FIG. 43 is a photoluminescent intensity-wavelength characteristic diagram of a material in Embodiment 16 of the present invention.

FIG. 43 is a photoluminescent intensity-wavelength relationship diagram of a quasi-two-dimensional blue-light PBA$_{1.1}$-(Cs$_{0.7}$FA$_{0.3}$)PbBr$_3$ material introduced with SFB10. It can be seen from the figure that the introduction of SFB10 greatly improves the photoluminescent intensity of the material, which indicates that SFB10 can reduce a defect state density of quasi-two-dimensional blue-light perovskite.

17. Embodiment 17 Preparation of Novel Stable and Efficient Perovskite Light-Emitting Diode An ITO glass substrate was adopted, a perovskite precursor solution was dissolved in 1 mL of DMSO according to a molar ratio of Tween20:CsBr:PbBr$_2$:PbCL$_2$:SFB10=1.6:1.5:0.39:0.61:x (x=0-0.5) to prepare 0.1 M solution, subjected to spin coating at 5,000 rpm, and annealed at 70° C. for 10 minutes after finishing the spin coating to obtain a perovskite material.

Figure 44:
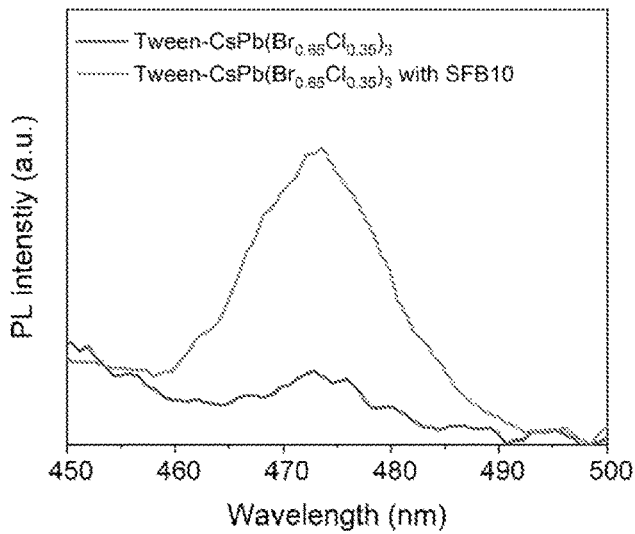
FIG. 44 is a photoluminescent intensity-wavelength characteristic diagram of a material in Embodiment 17 of the present invention.

FIG. 44 is a photoluminescent intensity-wavelength relationship diagram of a three-dimensional blue-light Tween-CsPb(Br$_{0.65}$Cl$_{0.35}$)$_3$ material introduced with SFB10. It can be seen from the figure that the introduction of SFB10 greatly improves the photoluminescent intensity of the material, which indicates that SFB10 can reduce a defect state density of three-dimensional blue-light perovskite.

To sum up, the present invention discloses the perovskite material with the stable dipolar molecules and the optoelectronic devices, wherein a component of the perovskite material doped with the stabilizer is D: A'$_2$A$_{n-1}$B$_n$X$_{3n+1}$ (n=1, 2, 3, . . . ) or D: ABX$_3$, wherein A' is an organic amine cation, A is a monovalent cation, B is a metal cation, X is a monovalent anion, and D is the dipolar molecule stabilizer. A preparation method of the perovskite material lies in: dissolving A'X, AX, BX and the dipolar molecular stabilizer in a solvent to obtain a perovskite precursor solution or a nanocrystal, and preparing the stable perovskite material and optoelectronic devices by a solution method; or, dissolving A'X, AX and BX in the solvent to obtain a perovskite precursor solution and preparing the perovskite material, and introducing the dipolar molecular stabilizer into the perovskite through postprocessing such as surface passivation and an anti-solvent method, thus preparing the stable perovskite material and the optoelectronic devices; or, preparing A'X, AX, BX and the dipolar molecular stabilizer into the stable perovskite material and the optoelectronic devices by a physical method such as evaporation, vapor deposition, magnetron sputtering and solid-state reaction; or, preparing A'X, AX and BX into the perovskite material by the non-solution method such as evaporation, vapor deposition, magnetron sputtering and solid-state reaction, and introducing the dipolar molecular stabilizer into the perovskite through postprocessing, thus preparing the stable perovskite material and the optoelectronic devices; or, preparing and producing the stable perovskite material and the optoelectronic devices by one or a combination of several of the above processes. According to the present invention, by utilizing the dipolar groups in the dipolar molecular stabilizer, the defect state density in the perovskite material is reduced and the ion migration in the perovskite material is inhibited, showing that a thermal stability, a phase stability and a photoluminescence stability of the material are enhanced, and a working stability and an efficiency of the perovskite optoelectronic devices are remarkably improved.

We claim:

1. A dipolar molecule-stabalized perovshite material comprising an A component; wherein the A component of the perovskite material is D: $A'_2A_{n-1}B_nX_{3n+1}$, wherein n=1, 2, 3, . . . , wherein A' is an organic amine cation, A is a monovalent cation, B is a metal cation, X is a monovalent anion, and D is a dipolar molecule stabilizer, and a molar ratio of D to B is higher than 0% and lower than or equal to 50% with a B-site as a reference; the dipolar molecular stabilizer is a molecular material with positively charged and negatively charged groups or atoms in molecules; and the dipolar molecular stabilizer contains atoms or groups capable of forming an interaction such as an ionic bond or a coordination bond with the anion X and the cations A', A and B in perovskite, wherein the positively charged atoms or groups comprise $N^+$, and the negatively charged atoms or groups comprise $SO^{3-}$, $PO^{4-}$, $COO^-$, $N^-$ and $O^-$.

2. The perovskite material according to claim 1, wherein the dipolar molecular stabilizer contains the positively charged and negatively charged groups or atoms capable of interacting with the anions and the cations in the perovskite, wherein the positively charged groups comprise but are not limited to $N^+$, and the negatively charged groups comprise $SO^{3-}$, $PO^{4-}$, $COO^-$, $N^-$ and $O^-$; the dipolar molecular stabilizer comprises the following compounds, and is any one or a mixture of several of the following compounds in any proportion: sulfobetaine 8, sulfobetaine 10, sulfobetaine 12, tetradecyl sulfopropyl betaine, hexadecyl sulfopropyl betaine, octadecyl sulfopropyl betaine, methacryloylethyl sulphobetiane, [3-(methacrylamido)propyl]dimethyl(3-thiopropyl)ammonium hydroxide, 3-[3-(cholamidopropyl)dimethylamino]propanesulfonic acid inner salt, (methoxycarbonylaminosulfonyl)triethylammonium hydroxide, 2-methacryloyloxyethyl phosphorylcholine, pyridinium propanesulfonate, (2-hydroxyethyl)dimethyl(3-sulfopropyl) ammonium hydroxide lactone, N-methylimidazolium sulfobutyrolactone, cocoamidopropyl betaine, dodecyldimethylamine oxide, 3-(benzyldimethylammonium)propanesulfonate.

3. The perovskite material according to claim 2, wherein the perovskite is prepared into 0.13 mol $L^{-1}$ precursor solution by dissolving FAI, $PbI_2$ and a dipolar molecular additive in 1 mL of DMF according to a molar ratio of 2:1:x, wherein x=0-0.5.

4. An optoelectronic device adopting the perovskite material according to claim 1, comprising a light emitting device, a solar battery, a field effect transistor and a detector optoelectronic devices; wherein the optoelectronic devices is composed of the perovskite material and one or more functional materials of a substrate, an anode, a hole transport layer, an electron transport layer and a cathode device; and materials of a light emitting film, photoluminescent powder, a nanocrystal, a quantum dot, a single crystal and an X-ray scintillator are applied.

5. The perovskite material according to claim 1, wherein a preparation method of the perovskite material comprises:
dissolving A'X, AX, BX and the dipolar molecular stabilizer in a solvent to obtain a perovskite precursor solution or a nanocrystal, and preparing the perovskite material and a optoelectronic devices by a solution method; or,
dissolving A'X, AX and BX in the solvent to obtain the perovskite precursor solution and preparing the perovskite material, and introducing the dipolar molecular stabilizer into the perovskite through postprocessing, thus preparing the stable perovskite material and the optoelectronic devices; or,
preparing A'X, AX, BX and the dipolar molecular stabilizer into the stable perovskite material and the optoelectronic devices by a non-solution method such as evaporation, vapor deposition, magnetron sputtering and solid-state reaction; or, preparing A'X, AX and BX into the perovskite material by the non-solution method such as evaporation, vapor deposition, magnetron sputtering and solid-state reaction, and introducing the dipolar molecular stabilizer into the perovskite through postprocessing, thus preparing the stable perovskite material and the optoelectronic devices; or, preparing and producing the stable perovskite material and the optoelectronic devices by one or a combination of several of the above processes.

6. The perovskite material according to claim 1, wherein the dipolar molecular stabilizer adjusts a crystallization rate of the perovskite material through a chemical action, and improves a crystallinity.

7. The perovskite material according to claim 1, wherein the dipolar molecular stabilizer improves thermal stabilities, phase stabilities and photoluminescence stabilities of the perovskite material and a perovskite device.

8. The perovskite material according to claim 1, wherein the dipolar molecular stabilizer reduces a defect state density of the perovskite material, and improves a working stability and an efficiency of a perovskite device.

9. The perovskite material according to claim 1, wherein the dipolar molecular stabilizer inhibits ion migration in the perovskite material, and inhibits hysteresis of a perovskite optoelectronic devices during working.

* * * * *

UNITED STATES PATENT AND TRADEMARK OFFICE
CERTIFICATE OF CORRECTION

| | | |
|---|---|---|
| PATENT NO. | : 12,150,375 B2 | Page 1 of 1 |
| APPLICATION NO. | : 18/499841 | |
| DATED | : November 19, 2024 | |
| INVENTOR(S) | : Dawei Di et al. | |

It is certified that error appears in the above-identified patent and that said Letters Patent is hereby corrected as shown below:

In the Specification

Item (54) and in the Specification, Column 1, Lines 1-3, The correct title should be:
DIPOLAR MOLECULE STABILIZED PEROVSKITE MATERIAL AND OPTOELECTRONIC DEVICES Signed and Sealed this
Twenty-fourth Day of December, 2024

Derrick Brent
*Acting Director of the United States Patent and Trademark Office*